(12) United States Patent
Uenishi

(10) Patent No.: US 6,887,645 B2
(45) Date of Patent: May 3, 2005

(54) NEGATIVE RESIST COMPOSITION

(75) Inventor: Kazuya Uenishi, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 426 days.

(21) Appl. No.: 09/942,768

(22) Filed: Aug. 31, 2001

(65) Prior Publication Data
US 2002/0061462 A1 May 23, 2002

(30) Foreign Application Priority Data
Aug. 31, 2000 (JP) .................................. P.2000-263815

(51) Int. Cl.⁷ .............................................. G03F 7/004
(52) U.S. Cl. ................... 430/270.1; 430/296; 430/914; 430/325; 430/966; 430/942
(58) Field of Search .............................. 430/270.1, 296, 430/914, 325, 966, 942

(56) References Cited

U.S. PATENT DOCUMENTS

| | | |
|---|---|---|
| 5,022,959 A | 6/1991 | Itoh et al. |
| 5,340,697 A | 8/1994 | Yoshimoto et al. |
| 5,674,573 A | 10/1997 | Mitani et al. |
| 5,998,100 A | 12/1999 | Azuma et al. |

FOREIGN PATENT DOCUMENTS

| | | |
|---|---|---|
| DE | 44 35 791 A1 | 4/1995 |
| EP | 0 381 109 A2 | 8/1990 |
| EP | 0 634 696 A1 | 1/1995 |
| EP | 0 901 156 A2 | 3/1999 |
| EP | 1 117 002 A1 | 7/2001 |
| JP | 11-026578 | 1/1997 |
| JP | 09-045633 | 2/1997 |
| JP | 10-254135 | 9/1998 |
| WO | WO 00/05763 A1 | 2/2000 |

OTHER PUBLICATIONS

European Search Report dated Jan. 15, 2002.
European Search Report for 01102401.5–1235, dated Jun. 9, 2004 (AMAT/4227.EP).

*Primary Examiner*—Amanda Walke
(74) *Attorney, Agent, or Firm*—Sughrue Mion, PLLC

(57) ABSTRACT

A negative resist composition comprises:

(A) an alkali-soluble resin;

(B) a compound capable of generating an acid upon irradiation with a radiation;

(C) a crosslinking agent capable of crosslinking by the action of an acid; and (D) a solvent mixture containing: at least one solvent selected from the group A below; and at least one selected from the group consisting of the group B below and the group C below:

group A: a propylene glycol monoalkyl ether carboxylate;
  group B: a propylene glycol monoalkyl ether, an alkyl lactate, an acetic ester, a chain ketone and an alkyl alkoxypropionate;
  group C: a γ-butyrolactone, an ethylene carbonate and a propylene carbonate.

20 Claims, No Drawings

NEGATIVE RESIST COMPOSITION

FIELD OF THE INVENTION

This invention relates to negative resist composition which is appropriately usable in ultramicrolithographic processes for producing, for example, VLSIs (very large-scale integrations) and microchips, and other photofabrication processes. More particularly, it relates to negative resist composition whereby highly fine patterns can be formed with the use of X-rays, electron beams and the like. In particular, it relates to negative resist composition which is appropriately usable in finely processing semiconductor devices by using high-energy beams such as electron beams.

BACKGROUND OF THE INVENTION

The degrees of integration of integrated circuits have been increasing year by year. In producing semiconductor substrates such as VLSIs, it becomes necessary to form ultrafine patterns with a line width of a half micron or less. To satisfy this requirement, wavelength employed in alligners in photolithography has been more and more shortened and attempts are also made today to employ even far ultraviolet light and eximer laser beams (XeCl, KrF, ArF, etc.). Moreover, attempts have been also made to pattern at a further elevated degree of fineness by using electron beams or X-rays.

In particular, it has been required to develop negative resists for forming highly sensitive rectangular patterns with high resolution by using electron beams or X-rays which are considered as usable in the patterning techniques in the next generation or the subsequent generation.

In the electron beam lithography, a resist material is exposed to the energy emitted from an accelerated electron beam in the course of collision with atoms constituting the resist material and scattering. By using highly accelerated electron beams, the linearity is elevated and the effects of electron scattering is lessened, which makes it possible to form rectangular patterns with high resolution. On the other hand, the permeability of electron beams is elevated in such a case and thus the sensitivity is lowered. Thus, the sensitivity and resolution/resist pattern are compensated each other in the electron lithography. Therefore, it has been a problem how to manage both of these factors.

To cope with this situation, it has been a practice to use resists of the chemical amplification type mainly with the use of acid catalyst reactions to thereby elevate sensitivity. For negative resists, use has been effectively made of chemical amplification compositions containing alkali-soluble resins, acid-generating agents and acid crosslinking agents as the main components.

Concerning negative resists of the chemical amplification type, there have been proposed various alkali-soluble resins. For example, partly alkyl-etherified polyvinylphenols are disclosed by JP-A-8-152717; vinylphenol/styrene copolymers are disclosed by JP-A-6-67431 and JP-A-10-10733; novolak resins are disclosed by Japanese Patent NO.2,505, 033; and monodisperse polyvinylphenols are disclosed in JP-A-7-311463 and JP-A-8-292559 (the term "JP-A" as used herein means an "unexamined published Japanese patent application"). However, none of these alkali-soluble resins can establish both of sufficient sensitivity and resolution/resist pattern under the irradiation with electron beams or X-rays.

Concerning negative resists of the chemical amplification type, there have been proposed various acid-generating agents too. For example, organic halogen compounds are disclosed by JP-B-8-3635; iodonium salts and sulfonium salts are disclosed by JP-A-2-150848 and JP-A-6-199770; acid-generating agents containing Cl and Br are disclosed by JP-A-2-52348, JP-A-4-367864 and JP-A-4-367865; diazodisulfone and diazosulfone compounds are disclosed by JP-A-4-210960 and JP-A-4-217249; triazine compounds are disclosed by JP-A-4-226454; and sulfonate compounds are disclosed by JP-A-3-87746, JP-A-4-291259, JP-A-6-236024 and U.S. Pat. No. 5,344,742 (the term "JP-B" as used herein means an "examined Japanese patent publication"). However, none of these acid-generating agents can overcome the problem of the compensation of sensitivity and resolution/resist pattern under the irradiation with electron beams.

Concerning the crosslinking agents, use has been made of methylolmelamine, resol resins, epoxidized novolak resins, urea resins and the like. However, these crosslinking agents are unstable to heat and thus suffer from a problem of poor storage stability in the form of resist solutions. In addition, these crosslinking agents cannot satisfy the requirements for high sensitivity, high resolution and rectangular resist pattern under the irradiation with electron beams.

Namely, it has been required to establish resist compositions of the negative chemical amplification type for electron beams or X-rays whereby various properties including sensitivity, resolution, resist pattern, development defect, coating properties and solvent-solubility can be satisfied.

SUMMARY OF THE INVENTION

Accordingly, an object of the invention is to improve the performance of fine processing of semiconductor devices with the use of electron beams or X-rays and to solve the technical problems, further, to provide resist compositions of the negative chemical amplification type for electron beams or X-rays which satisfy properties including sensitivity, resolution, resist pattern, development defect, coating properties and solvent-solubility in using electron beams or X-rays.

The inventors have conducted intensive studies and consequently found out that the object of the invention can be achieved by using such specific compositions as will be shown hereinbelow, thereby completing the invention. Accordingly, the constitution of the invention is as follows.

(1) A negative resist composition to be irradiated with one of an electron beam and X ray comprising:

(A) an alkali-soluble resin;

(B) a compound capable of generating an acid upon irradiation with a radiation;

(C) a crosslinking agent capable of crosslinking by the action of an acid; and (D) one of solvent mixtures (DI) and (DII):

(DI) a solvent mixture containing at least one solvent selected from the group A below and at least one solvent selected from the group B below; and (DII) a solvent mixture containing at least one solvent selected from the group A below and at least one solvent selected from the group C below:

group A: a propylene glycol monoalkyl ether carboxylate;

group B: a propylene glycol monoalkyl ether, an alkyl lactate, an acetic ester, a chain ketone and an alkyl alkoxypropionate;

group C: a γ-butyrolactone, an ethylene carbonate and a propylene carbonate.

(2) A negative resist composition to be irradiated with one of an electron beam and X ray comprising:

(A) an alkali-soluble resin;

(B) a compound generating an acid upon irradiation with a radiation;

(C) a crosslinking agent capable of crosslinking by the action of an acid; and (D) a solvent mixture containing: at least one solvent selected from the group A below; at least one solvent selected from the group B below; and at least one solvent selected from the group C below:

group A: a propylene glycol monoalkyl ether carboxylate;

group B: a propylene glycol monoalkyl ether, an alkyl lactate, an acetic ester, a chain ketone and an alkyl alkoxypropionate;

group C: a γ-butyrolactone, an ethylene carbonate and a propylene carbonate.

(3) The negative resist composition as described in item (1) or (2), wherein the resin (A) contains a structural unit represented by formula (1):

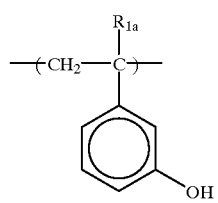

(1)

wherein $R_{1a}$ represents a hydrogen atom or a methyl group.

(4) The negative resist composition as described in item (1) or (2), wherein the resin (A) is a resin represented by formula (2):

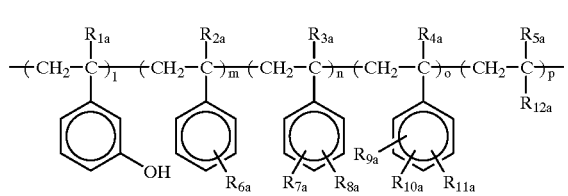

(2)

wherein $R_{1a}$ to $R_{5a}$ each independently represents a hydrogen atom or a methyl group; $R_{6a}$ to $R_{11a}$ each independently represents a hydrogen atom, an alkyl group having 1 to 4 carbon atoms, an alkoxy group having 1 to 4 carbon atoms, a hydroxyl group or $-C(=O)O-R_{14a}$; $R_{14a}$ represents a hydrogen atom or an alkyl group having 1 to 4 carbon atoms; $R_{12a}$ represents $-COOR_{15a}$; $R_{15a}$ represents a hydrogen atom or an alkyl group having 1 to 4 carbon atoms; $0<1\leq100$; $0\leq m<100$; $0\leq n<100$; $0\leq o<100$; $0\leq p<100$; and $l+m+n+o+p=100$.

(5) The negative resist composition as described in item (1) or (2), wherein the compound (B) contains at lease one compound represented by formulae (I) to (III):

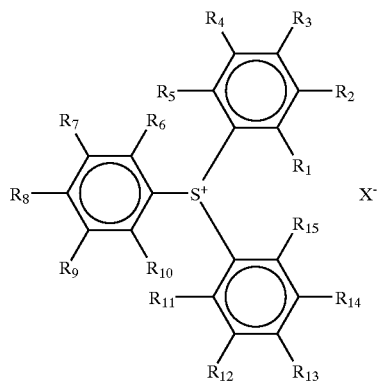

(I)

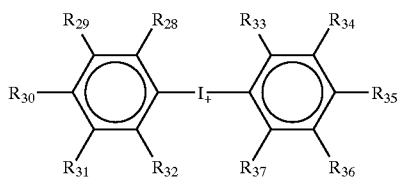

(II)

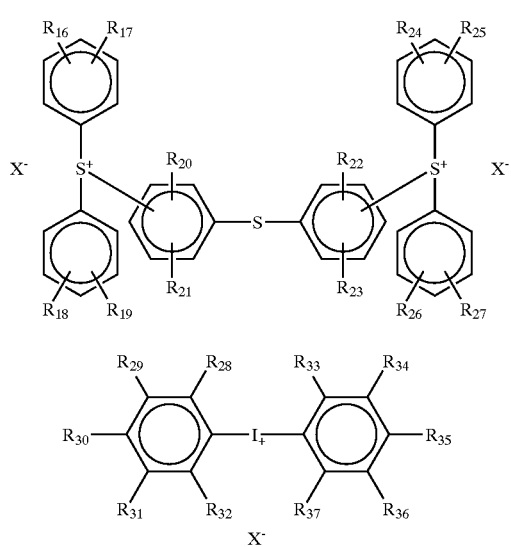

(III)

wherein $R_1$ to $R_{37}$ each independently represents a hydrogen atom, an alkyl group, an alkoxyl group, a hydroxyl group, a halogen atom or a group represented by $-S-R_{38}$; $R_{38}$ represents an alkyl group or an aryl group; two or more groups selected from $R_1$ to $R_{15}$ may be bonded to each other, either directly at the ends or mediated by an atom selected from oxygen, sulfur and nitrogen, to thereby form a cyclic structure; two or more groups selected from $R_{16}$ to $R_{27}$ may be bonded to each other, either directly at the ends or mediated by an atom selected from oxygen, sulfur and nitrogen, to thereby form a cyclic structure; two or more groups selected from $R_{28}$ to $R_{37}$ maybe bonded to each other, either directly at the ends or mediated by an atom selected from oxygen, sulfur and nitrogen, to thereby form a cyclic structure; and X⁻ represents an anion of an acid which is selected from a benzenesulfonic acid, naphthalenesulfonic acid and anthracenesulfonic acid and has at least one organic group selected from the group consisting of alkyl, alkoxyl, acyl, acyloxyl, sulfonyl, sulfonyloxy, sulfonylamino, aryl, aralkyl and alkoxycarbonyl groups.

(6) The negative resist composition as described in item (1) or (2), wherein the crosslinking agent (C) is a phenol derivative having:

3 to 5 benzene ring-atomic groups in its molecule;

a molecular weight of 1200 or less; and at least two substituents selected from the group consisting of hydroxymethyl and alkoxymethyl groups in the 3 to 5 benzene ring-atomic groups.

(7) The negative resist composition as described in item (1) or (2), which further comprises an organic basic compound.

(8) The negative resist composition as described in item (1) or (2), which further comprises a surfactant containing at least one of a fluorine atom and silicone atom.

(9) The negative resist composition as described in item (1) or (2), wherein the resin (A) has a molecular weight distribution (Mw/Mn) of from 1.0 to 1.4.

(10) The negative resist composition as described in item (1) or (2), wherein the resin (A) has a weight average molecular weight (Mw) of from 2000 to 9000.

(11) A method for forming a pattern comprises: applying the negative resist composition described in item (1) or (2) on a substrate to form a resist film; irradiating the resist film with one of an electron beam and X-ray; and developing the resist film.

DETAILED DESCRIPTION OF THE INVENTION

Now, compounds employed in the invention will be illustrated.

[1] Alkali-Soluble Resin Employed in the Invention

In the invention, an alkali-soluble resin is employed together with a radiosensitive acid-generating agent, etc. The alkali-soluble resin to be used together with the radiosensitive acid-generating agent, etc. is a resin that is insoluble in water but soluble in an aqueous alkali solution.

Examples of the alkali-soluble resin to be used together with the radiosensitive acid-generating agent, etc. include novolak resins, hydrogenated novolak resins, acetone-pyrogallol resin, poly-o-hydroxystyrene, poly-m-hydroxystyrene, poly-p-hydroxystyrene, hydrogenated polyhydroxystyrene, halogenated or alkylated polyhydroxystyrenes, hydroxystyrene-N-substituted maleimide copolymer, o/p- and m/p-hydroxystyrene copolymers, polyhydroxystyrenes partly o-alkylated at hydroxyl group (for example, o-methylated product, o-(1-methoxy) ethylated product, o-(1-ethoxy)ethylated product, o-2-tetrahydropyranylated product, o-(t-butoxycarbonyl) methylated product, etc. each at a ratio of 5 to 30% by mol), polyhydroxystyrenes partly o-acylated at hydroxyl group (for example, o-acetylated product, o-(t-butoxy) carbonylated product, etc. each at a ratio of 5 to 30% by mol), styrene-maleic anhydride copolymer, styrene-hydroxystyrene copolymer, α-methylstyrene-hydroxystyrene copolymer, carboxylated methacrylic resins and derivatives thereof, though the invention is not restricted thereto.

Among the alkali-soluble resins as cited above, it is particularly preferable to use novolak resins, poly-o-hydroxystyrene, poly-m-hydroxystyrene, poly-p-hydroxystyrene and copolymers thereof, alkylated polyhydroxystyrenes, polyhydroxystyrenes partly o-alkylated or o-acylated, styrene-hydroxystyrene copolymer or α-methylstyrene-hydroxystyrene copolymer.

The novolak resins as described above can be obtained by using a definite monomer as the main component and addition-condensing with an aldehyde in the presence of an acidic catalyst.

As the definite monomer, use can be made of aromatic hydroxy compounds, either alone or as a mixture thereof, such as phenol, cresols such as m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, p-t-butylphenol, p-octylphenol and 2,3,5-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, m-propoxyphenol, p-propoxyphenol, m-butoxyphenol and p-butoxyphenol, bisalkylphenols such as 2-methyl-4-isopropylphenol, m-chlorophenol, p-chlorophenol, o-chlorophenol, dihydroxybiphenyl, bisphenol A, phenylphenol, resorcinol and napththol, though the invention is not restricted thereto.

As the aldehyde, use can be made of, for example, formaldehyde, paraformaldehyde, acetaldehyde, propionaldehyde, benzaldehyde, phenyacetaldehyde, α-phenypropylaldehyde, β-phenypropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzladehyde, m-methylbenzaldehyde, p-methylbenzaldehyde, p-ethylbenzaldehyde, p-n-butylbenzaldehyde, furfural, chloroacetaldehyde and acetal derivatives thereof such as chloroacetaldehyde diethyl acetal. Among these aldehdyes, it is preferable to use formaldehyde.

Either one of these aldehydes or a combination of two or more thereof may be used. As the acidic catalyst, use can be made of hydrochloric acid, sulfuric acid, formic acid, acetic acid, oxalic acid or the like.

It is preferable that the novolak resin thus obtained has a weight-average molecular weight of from 1,000 to 30,000. In case where its weight-average molecular weight is less than 1,000, serious film loss arises in exposed parts. In case where the weight-average molecular weight exceeds 30,000, the development speed is lowered. It is particularly appropriate that the weight-average molecular weight ranges from 2,000 to 20,000.

The above-described polyhydroxystyrene, derivatives thereof and copolymers other than the novolak resins have weight-average molecular weights of 2,000 or more, preferably from 2,000 to 30,000 and still preferably from 2,000 to 20,000.

The term "weight-average molecular weight" as used herein is defined as the value determined by gel permeation chromatography on the basis of polystyrene.

It is preferable that the alkali-soluble resin has a dissolution speed in alkali of 20 Å/sec or above (when determined in 0.261 N tetramethylammonium hydroxide (TMAH) at 23° C.), still preferably 200 Å/sec or above.

Alkali-soluble resins particularly preferable as the alkali-soluble resin to be used in the invention are resins having structural units represented by the above general formula (1). In addition to the structural unit represented by the general formula (1), such an alkali-soluble resin may contain other repeating unit(s). Preferable examples of such copolymerization components are repeating units corresponding to the following monomers (4) to (7).

The alkali-soluble resin to be used in the invention having a structural unit represented by the general formula (1) can be obtained by radical polymerizing or living anion polymerizing the following monomer (3) optionally together with the monomers (4) to (7).

(3) 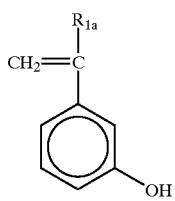

(4) 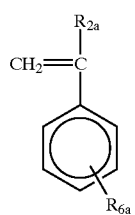

(5) 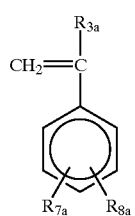

(6) 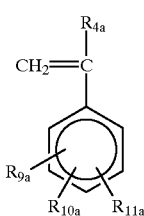

(7) 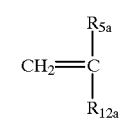

In the above formulae, $R_{1a}$ to $R_{12a}$ are each the same as defined above.

In case of using a monomer having hydroxyl group in its molecule among the monomers as cited above, it is preferable that the hydroxyl group is preliminarily protected and then the protective group is eliminated after the completion of the polymerization.

In the invention, the resin may contain the structural unit represented by the general formula (1) in an arbitrary amount, so long as the effects of the invention can be achieved thereby. More particularly speaking, the content of the structural unit (1) preferably ranges from 30 to 100% by mol, still preferably from 50 to 90% by mol, based on the total repeating units.

In the invention, it is preferable that the alkali-soluble resin is a resin represented by the general formula (2). Thus, the effects of the invention become more obvious.

In the general formula (2), $R_{1a}$ to $R_{5a}$ represent each a hydrogen atom or a methyl group. Alkyl or alkoxy groups having 1 to 4 carbon atoms represented by $R_{6a}$ to $R_{11a}$, $R_{14a}$ and $R_{15a}$ may be either linear or branched. Examples of the alkyl groups include methyl, ethyl, propyl, isopropyl, butyl, isobutyl and t-butyl groups. Examples of the alkoxy groups include methoxy, ethoxy, propoxy, isopropoxy, butoxy, isobutoxy and t-butoxy groups.

$R_{16a}$ represents an optionally substituted, branched or cyclic alkyl groups having 1 to 10 carbon atoms (particular example thereof including ethyl, propyl, isopropyl, butyl, isobutyl, t-butyl, cyclohexyl, cyclohexylethyl and phenoxyethyl groups), an optionally substituted aryl group having 6 to 20 carbon atoms (particular example thereof including phenyl, tolyl, xylyl, biphenyl, naphthyl, halogenated phenyl and nitrophenyl groups), or an optionally substituted aralkyl group having 7 to 20 carbon atoms (particular example thereof including benzyl, phenethyl and phenylpropyl groups).

In the general formula (2), l, m, o and p each independently represents molar ratio of a structural unit, and $0<1\leq100$, still preferably $30<1\leq100$ and still preferably $50<1\leq90$. Concerning m, n, o and p, $0<m, n, o, p<100$, still preferably $20\leq m, n, o, p<70$ and still preferably $30\leq m, n, o, p<50$, and $l+m+n+o+p=100$.

It is preferable that the alkali-soluble resin thus obtained has a weight-average molecular weight of from 1,000 to 30,000. In case where its weight-average molecular weight is less than 1,000, serious film loss arises in exposed parts. In case where the weight-average molecular weight exceeds 30,000, the development speed is lowered. It is particularly appropriate that the weight-average molecular weight ranges from 2,000 to 20,000.

An alkali-soluble resin which is particularly preferable because of having a particularly high sensitivity has a weight-average molecular weight of from 2,000 to 9,000, still preferably from 2,500 to 9,000 and still preferably from 3,000 to 9,000, It is also preferable that the molecular weight distribution (Mw/Mn) of the alkali-soluble resin is from 1.0 to 1.5 (i.e., a monodisperse polymer), since the development residue is lessened in this case. An alkali-soluble resin which is particularly preferable because of having a particularly high sensitivity has a molecular weight distribution (Mw/Mn) of from 1.0 to 1.4, still preferably from 1.0 to 1.3 and still preferably from 1.0 to 1.2.

The term "weight-average molecular weight" as used herein is defined as the value determined by gel permeation chromatography on the basis of polystyrene.

The alkali-soluble resin in the invention having a molecular weight distribution of from 1.0 to 1.4 (preferably from 1.0 to 1.3 and still preferably from 1.0 to 1.2) can be synthesized by the publicly known living anion polymerization. It can be also obtained by molecular weight fractionation.

The living anion polymerization is described in Shin Jikken Kagaku Koza 19 (Maruzen) Kobunshi Kagaku (I) pp. 59–73. On the other hand, the molecular weight fractionation is described in Shin Jikken Kagaku Koza 19 (Maruzen) Kobunshi Kagaku (II) pp. 522–527.

It is preferable that the alkali-soluble resin has a dissolution speed in alkali of 20 Å/sec or above (when determined in 0.261 N tetramethylammonium hydroxide (TMAH) at 23° C.), still preferably 200 Å/sec or above.

The alkali-soluble resin having the structural unit represented by the formula (1) may be used alone. Alternatively, it may be used together with other alkali-soluble resins. Per 100 parts by weight of the alkali-soluble resin having the structural unit represented by the formula (1), other alkali-soluble resins may be used in an amount up to 100 parts by weight. Examples of the other alkali-soluble resins usable herein are as follows.

For example, use can be made of novolak resins, hydrogenated novolak resins, acetone-pyrogallol resin, poly-o-hydroxystyrene, poly-p-hydroxystyrene, hydrogenated polyhydroxystyrene, halogenated or alkylated polyhydroxystyrenes, hydroxystyrene-N-substituted maleimide copolynmer, o/p-hydroxystyrene copolymer, polyhydroxystyrenes partly o-alkylated at hydroxyl group (for example, o-methylated product, o-(1-methoxy)ethylated product, o-(1-ethoxy)ethylated product, o-2-tetrahydropyranylated product, o-(t-butoxycarbonyl) methylated product, etc. each at a ratio of 5to 30% by mol), polyhydroxystyrenes partly o-acylated (for example, o-acetylated product, o-(t-butoxy)carbonylated product, etc. each at a ratio of 5 to 30% by mol), styrene-maleic anhydride copolymer, styrene-hydroxystyrene copolymer, α-methylstyrene-hydroxystyrene copolymer, carboxylated methacrylic resins and derivatives thereof, though the invention is not restricted thereto.

The total content of the alkali-soluble resins ranges usually from 30 to 90% by weight, preferably from 50 to 80% by weight, based on the weight of the whole resist composition excluding the solvent.

[2] A Compound Capable of Generating an Acid upon Irradiation with a Radiation (a Radiosensitive Acid-generating Agent; Hereinafter also Called Acid-generating Agent)

An acid-generating agent is used together with the alkali-soluble resin. The acid-generating agent to be used together with the alkali-soluble resin may be an arbitrary compound so long as it can generate an acid under radiation.

Such an acid-generating agent may be appropriately selected from photoinitiators for photocation polymerization, photoinitiators for photoradical polymerization, photodecoloring agents for dyes, photodiscoloring agents, compounds publicly known as generating acids under light irradiation which are employed in micro resists, etc. and mixtures thereof.

For example, use may be made of onium salts such as diazonium salts, iodonium salts, sulfonium salts, selenonium salts and arsonium salts, organic halogen compounds, organic metal/organic halides, acid-generating agents having o-nitrobenzyl type protective groups, compounds undergoing photocomposition to produce sulfonic acid typified by iminosulfonate, and disulfone compounds.

It is also possible to use compounds having these acid-producing groups or compounds introduced into the main or side chains of polymers, for example, compounds described in JP-A-63-26653, JP-A-55-164824, JP-A-62-69263, JP-A-63-146083, JP-A-63-163452 and JP-A-62-153853, JP-A-63-146029.

Moreover, it is possible to use compounds producing acids under light irradiation which are described in U.S. Pat. No. 3,779,778 EP 126,712, etc.

In the invention, it is preferable to use onium salt compounds represented by the above general formulae (I) to (III).

Also, it is preferable to use onium salt compounds generating organic acids having a fluorine atom.

In the general formulae (I) to (III), $R_1$ to $R_{37}$ represent each a hydrogen atom, an alkyl group, an alkoxy group, a hydroxyl group, a halogen atom or a group represented by —S—$R_{38}$.

The alkyl groups represented by $R_1$ to $R_{37}$ may be linear, branched or cyclic. Examples of linear or branched alkyl groups include those having 1 to 4 carbon atoms such as methyl, ethyl, propyl, n-butyl, sec-butyl and t-butyl groups. Examples of cyclic alkyl groups include those having 3 to 8 carbon atoms such as cyclopropyl, cyclopentyl and cyclohexyl groups.

The alkoxy groups represented by $R_1$ to $R_{37}$ may be linear, branched or cyclic. Examples of linear or branched alkoxy groups include those having 1 to 8 carbon atoms such as methoxy, ethoxy, hydroxyethoxy, propoxy, n-butoxy, isobutoxy, sec-butoxy, t-butoxy and octyloxy groups. Examples of the cyclic alkoxy groups include cyclopentyloxy and cyclohexyloxy groups.

Examples of the halogen atoms represented by $R_1$ to $R_{37}$ include fluorine, chlorine, bromine and iodine atoms.

$R_{38}$ in —S—$R_{38}$ represented by $R_1$ to $R_{37}$ is an alkyl or aryl group. As the scope of the alkyl group represented by $R_{38}$, the alkyl groups cited above as examples of the alkyl groups represented by $R_1$ to $R_{37}$ may be cited.

Examples of the aryl group represented by $R_{38}$ include those having 6 to 14 carbon atoms such as phenyl, tollyl, methoxyphenyl and naphthyl groups.

Each of the alkyl to aryl groups represented by $R_1$ to $R_{38}$ may have substituents attached to a part thereof and thus carry more carbon atoms. Alternatively, such groups may have no substituent. As the substituents optionally attached, citation may be preferably made of alkoxy groups having 1 to 4 carbon atoms, aryl groups having 6 to 10 carbon atoms and alkenyl groups having 2 to 6 carbon atoms, as well as cyano, hydroxy, carboxy, alkoxycarbonyl and nitro groups. Further, halogen atoms, for example, fluorine, chlorine and iodine atoms may be attached thereto.

Two or more of the groups represented by $R_1$ to $R_{15}$ in the general formula (I) may be bonded together to form a ring. Groups represented by $R_1$ to $R_{15}$ may be bonded directly to each other at the ends thereof to form such a ring. Alternatively, they may be bonded indirectly to each other via one or more elements selected from among carbon, oxygen, sulfur and nitrogen to thereby form a ring. Examples of the cyclic structure formed by two or more of the groups represented by $R_1$ to $R_{15}$ which are bonded to each other include the same cyclic structures as those observed in furan, dihydrofuran, pyran, trihydropyran, thiophene and pyrrole rings. The same applies to the groups represented by $R_{16}$ to $R_{27}$ in the general formula (II). Namely, two or more of these groups may be bonded, either directly or indirectly, to each other to form a ring. The same applies to the groups represented by $R_{28}$ to $R_{37}$ in the general formula (III).

The general formulae (I) to (III) have $X^-$. $X^-$ in the general formulae (I) to (III) is an anion of an acid. The acid forming the anion is a member selected from among benzenesulfonic acid, naphthalenesulfonic acid and anthracenesulfonic acid. It is preferable that this acid is substituted by one or more fluorine atoms. The acid has at least one organic group selected from the group consisting of alkyl, alkoxyl, acyl, acyloxyl, sulfonyl, sulfonyloxy, sulfonylamino, aryl, aralkyl and alkoxycarbonyl groups. It is still preferable that the organic group is further substituted by at least one fluorine atom. The above-described benzenesulfonic acid, naphthalenesulfonic acid or anthracenesulfonic acid may be substituted by a halogen atom other than fluorine, a hydroxyl group, a nitro group, etc.

The alkyl group attached to the benzenesulfonate or the like forming $X^-$ is an alkyl group having 1 to 12 carbon atoms. The alkyl group may be either linear, branched or cyclic. It is preferable that the alkyl group is substituted by 1 to 25 fluorine atoms. Particular examples thereof include tirfluoromethyl, pentafluoroethyl, 2,2,2-trifluoroethyl, heptafluoroethyl, heptafluoroisopropyl, perfluorobutyl, perfluorooctyl, perfluorododecyl and perfluorocylohexyl groups. Among all, a perfluoroalkyl group wherein an alkyl group having 1 to 4 carbon atoms is completely fluorinated is preferable.

The alkoxy group attached, either alone or together with the alkyl group, to the above-described benzenesulfonic acid, etc. is one having 1 to 12 carbon atoms. The alkoxy group may be either linear, branched or cyclic. It is preferable that the alkoxy group is substituted by 1 to 25 fluorine atoms. Particular examples thereof include trifluoromethoxy, pentafluoroethoxy, heptafluoroisopropyloxy, perfluorobutoxy, perfluorooctyloxy and perfluorododecyloxy, perfluorocyclohexyloxy groups. Among all, a perfluoroalkoxy group wherein an alkoxy group having 1 to 4 carbon atoms is completely fluorinated is preferable.

It is preferable that the acyl group attached, either alone or together with the alkyl group, to the above-described benzenesulfonic acid, etc. is one having 2 to 12 carbon atoms and substituted by 1 to 23 fluorine atoms. Particular examples thereof include tirfluoroacetyl, fluoroacetyl, pentafluoropropionyl and pentafluorobenzoyl groups.

It is preferable that the acyloxy group attached, either alone or together with the alkyl group, to the above-described benzenesulfonic acid, etc. is one having 2 to 12 carbon atoms and substituted by 1 to 23 fluorine atoms. Particular examples thereof include trifluoroacetoxy, fluoroacetoxy, pentafluoropropionyloxy and pentafluorobenzoyloxy groups.

It is preferable that the sulfonyl group attached, either alone or together with the alkyl group, to the above-described benzenesulfonic acid, etc. is one having 1 to 12 carbon atoms and substituted by 1 to 25 fluorine atoms. Particular examples thereof include trifluoromethanesulfonyl, pentafluoroethanesulfonyl, perfluorobutanesulfonyl, perfluorooctanesulfonyl, pentafluorobenzenesulfonyl and 4-trifluoromethylbenzenesulfonyl groups.

It is preferable that the above-described sulfonyloxy group attached, either alone or together with the alkyl group, to the above-described benzenesulfonic acid, etc. is one having 1 to 12 carbon atoms and substituted by 1 to 25 fluorine atoms. Particular examples thereof include trifluoromethanesulfonyloxy, perfluorobutanesulfonyloxy and 4-trifluoromethylbenzenesulfonyloxy groups.

It is preferable that the above-described sulfonylamino group attached, either alone or together with the alkyl group, to the above-described benzenesulfonic acid, etc. is one having 1 to 12 carbon atoms and substituted by 1 to 25 fluorine atoms. Particular examples thereof include trifluoromethanesulfonylamino, perfluorobutanesulfonylamino, perfluorooctanesulfonylamino and pentafluorobenzenesulfonylamino groups.

It is preferable that the above-described aryl group attached, either alone or together with the alkyl group, to the above-described benzenesulfonic acid, etc. is one having 6 to 14 carbon atoms and substituted by 1 to 9 fluorine atoms. Particular examples thereof include pentafluorophenyl, 4-trifluoromethylphenyl, heptafluoronaphthyl, nonafluoroanthranyl, 4-fluorophenyl and 2,4-difluorophenyl groups.

It is preferable that the above-described aralkyl group attached, either alone or together with the alkyl group, to the above-described benzenesulfonic acid, etc. is one having 7 to 10 carbon atoms and substituted by 1 to 15 fluorine atoms. Particular examples thereof include pentafluorophenylmethyl, pentafluorophenylethyl, perfluorobenzyl and perfluorophenethyl groups.

It is preferable that the above-described alkoxycarbonyl group attached, either alone or together with the alkyl group, to the above-described benzenesulfonic acid, etc. is one having 2 to 13 carbon atoms and substituted by 1 to 25 fluorine atoms. Particular examples thereof include trifluoromethoxycarbonyl, pentafluoroethoxycarbonyl, pentafluorophenoxycarbonyl, perfluorobutoxycarbonyl and perfluorooctyloxycarbonyl groups.

Among these anions, it is preferable that $X^-$ is a fluorinated benzenesulfonate anion, still preferably pentafluorobenzenesulfonate anion.

The fluorinated benzenesulfonic acid, naphthalenesulfonic acid or anthracenesulfonic acid as described above may be further substituted by linear, branched or cyclic alkoxy, acyl, acyloxy, sulfonyl, sulfonyloxy, sulfonylamino, aryl, aralkyl or alkoxycarbonyl groups (each having carbon atoms in the number within the range as defined above), halogens (excluding fluorine), hydroxyl group, nitro group and the like.

Particular examples of the compounds represented by the general formulae (I) to (III) areas follows, though the invention is not restricted thereto.

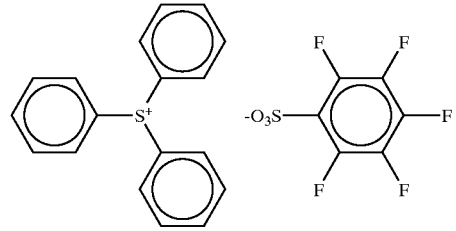

(I-1)

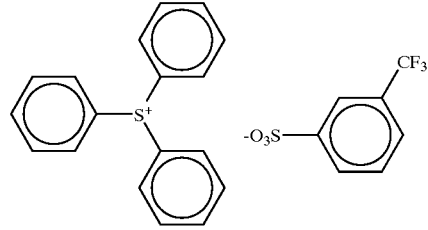

(I-2)

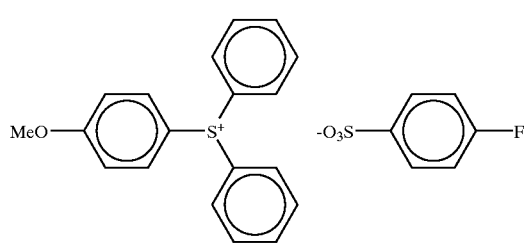

(I-3)

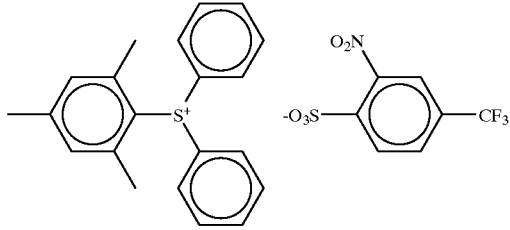

(I-4)

(I-5) 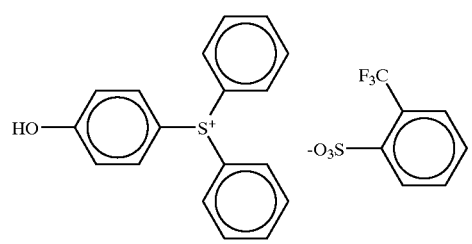
(I-6) 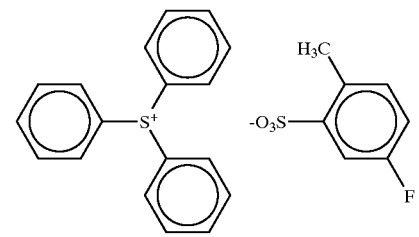
(I-7) 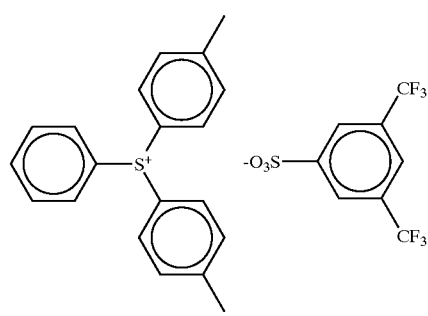
(I-8) 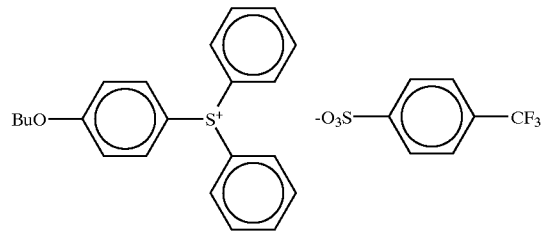
(I-9) 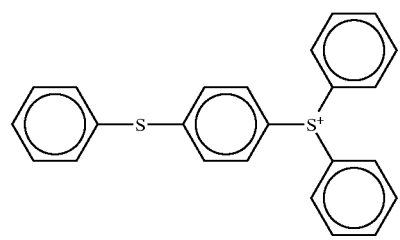
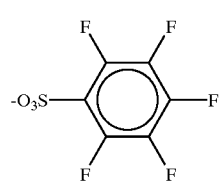
(I-10) 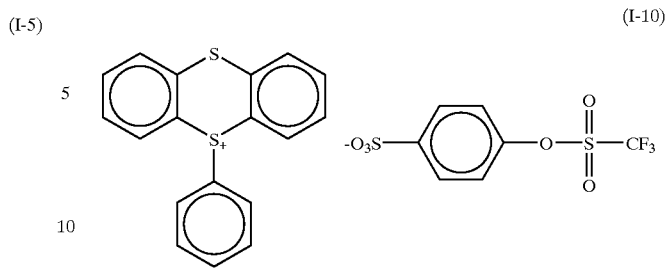
(I-11) 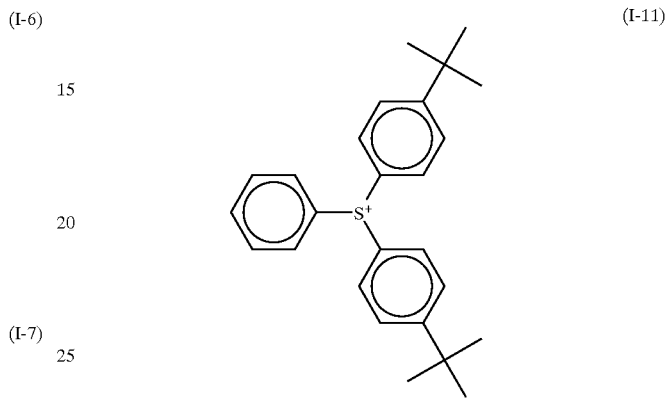
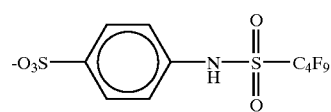
(I-12) 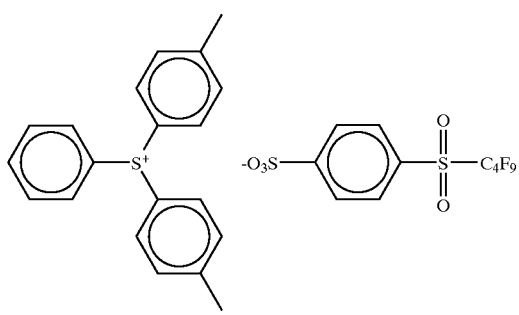
(I-13) 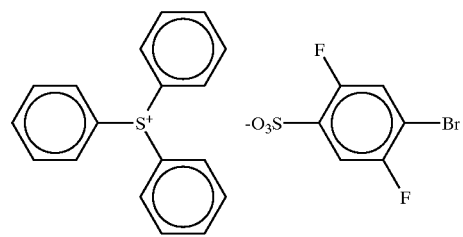
(I-14) 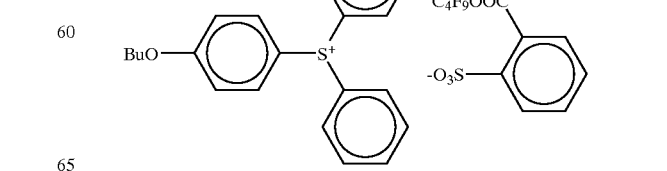

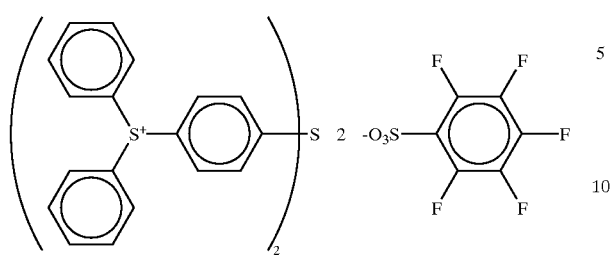

-continued

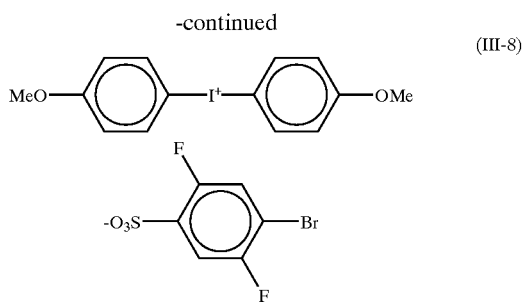

(III-8)

The compounds of the general formulae (I) and (II) can be synthesized in the following manner. For example, an aryl Grignard reagent such as aryl magnesium bromide is reacted with phenyl sulfoxide. Then the triaryl sulfonium halide thus obtained is salt-exchanged with a corresponding sulfonic acid. In an alternative method, for example, phenyl sulfoxide and a corresponding aromatic compound are condensed and salt-exchanged with the use of an acid catalyst such as methanesulfonic acid/diphosphorus pentaoxide or aluminum chloride. Alternatively, such a compound can be synthesized by condensing and salt-exchanging a diaryl iodonium salt with diaryl sulfide with the use of a catalyst such as copper acetate. In each of the above-described methods, the phenyl sulfoxide may be either substituted at the benzene ring or not.

The compounds of the general formula (III) can be synthesized by reacting an aromatic compound with the use of a periodic acid salt.

In the invention, the acid-generating agent is used appropriately in an amount of from 0.1 to 20% by weight, preferably from 0.5 to 10% by weight and still preferably from 1 to 7% by weight, based on the solid content of the whole negative resist composition.

(Other Acid-Generating Agent)

In the invention, use may be also made of other acid-generating agents other than the compounds represented by the above-described general formulae (I) to (III) or together with these compounds. In case where another compound, which is capable of decomposing under irradiation to generate an acid, is used together with a compound represented by one of the general formulae (I) to (III), the compound capable of decomposing under irradiation to generate an acid is used at a molar ratio of from 100/0 to 20/80, preferably from 90/10 to 40/60 and still preferably from 80/20 to 50/50.

[3] A Crosslinking Agent Capable of Crosslinking by the Action of an Acid (a Compound Undergoing Crosslinkage Under the Action of an Acid; Hereinafter Referred to as an Acid Crosslinking Agent or Merely a Crosslinking Agent)

In the negative resist composition according to the invention, the crosslinking agent is employed together with the alkali-soluble resin and the acid-generating agent.

As the crosslinking agent, use can be made of phenol derivatives.

Preferable examples of the phenol derivatives are those having a molecular weight of 1200 or less, containing 3 to 5 benzene ring atomic groups per molecule and having 2 or more hydroxymethyl groups or alkoxymethyl groups in total, wherein these hydroxymethyl groups or alkoxymethyl groups are all attached to a benzene ring or attached to plural benzene rings. Use of these phenol derivatives can make the effects of the invention more remarkable.

It is preferable that the alkoxymethyl group attached to the benzene ring has 6 or less carbon atoms. Preferable examples thereof include methoxymethyl, ethoxymethyl, n-propoxymethyl, i-propoxymethyl, n-butoxymethyl, i-butoxymethyl, sec-butoxymethyl and t-butoxymethyl groups. It is also preferable to use alkoxylated alkoxy groups such as 2-methoxyethoxy and 2-methoxy-1-propyl groups.

Particularly preferable examples of these phenol derivatives are as follows.

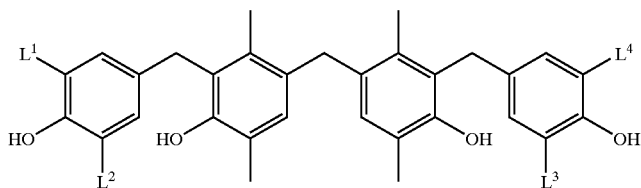

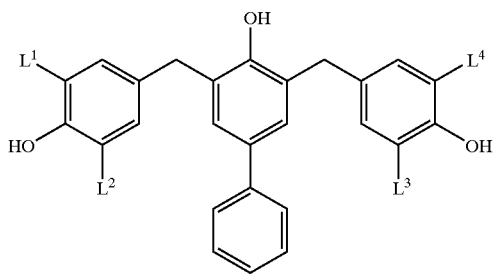

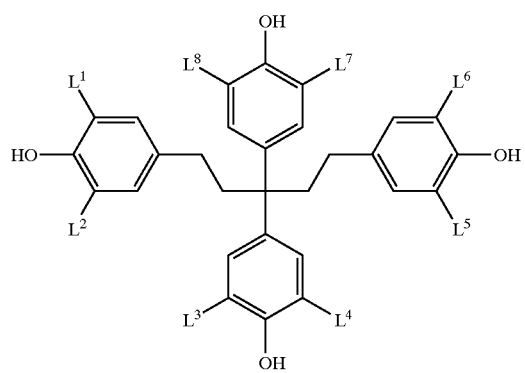

-continued
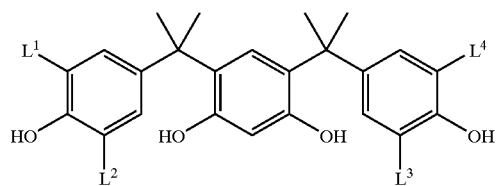
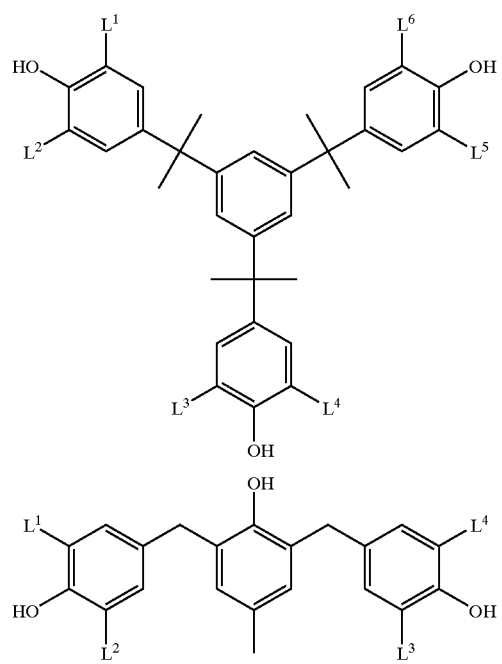
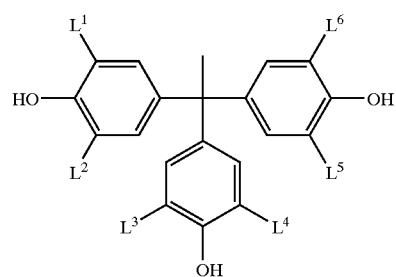
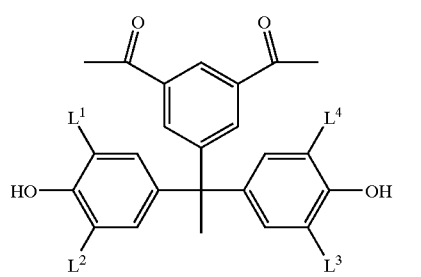
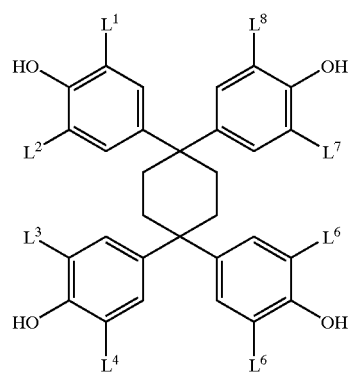
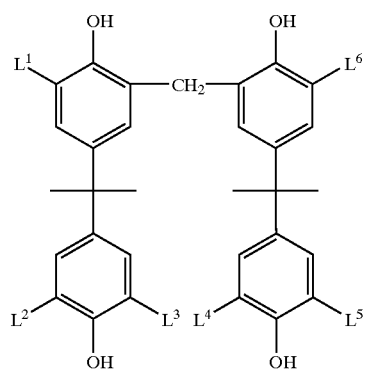
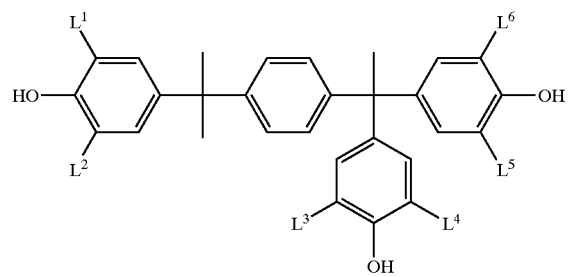
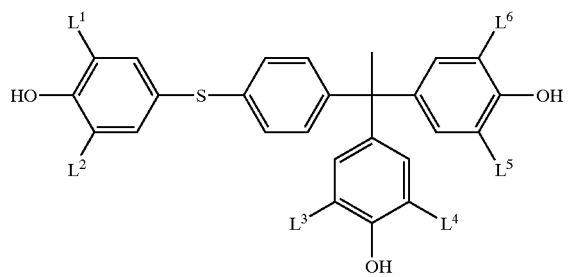

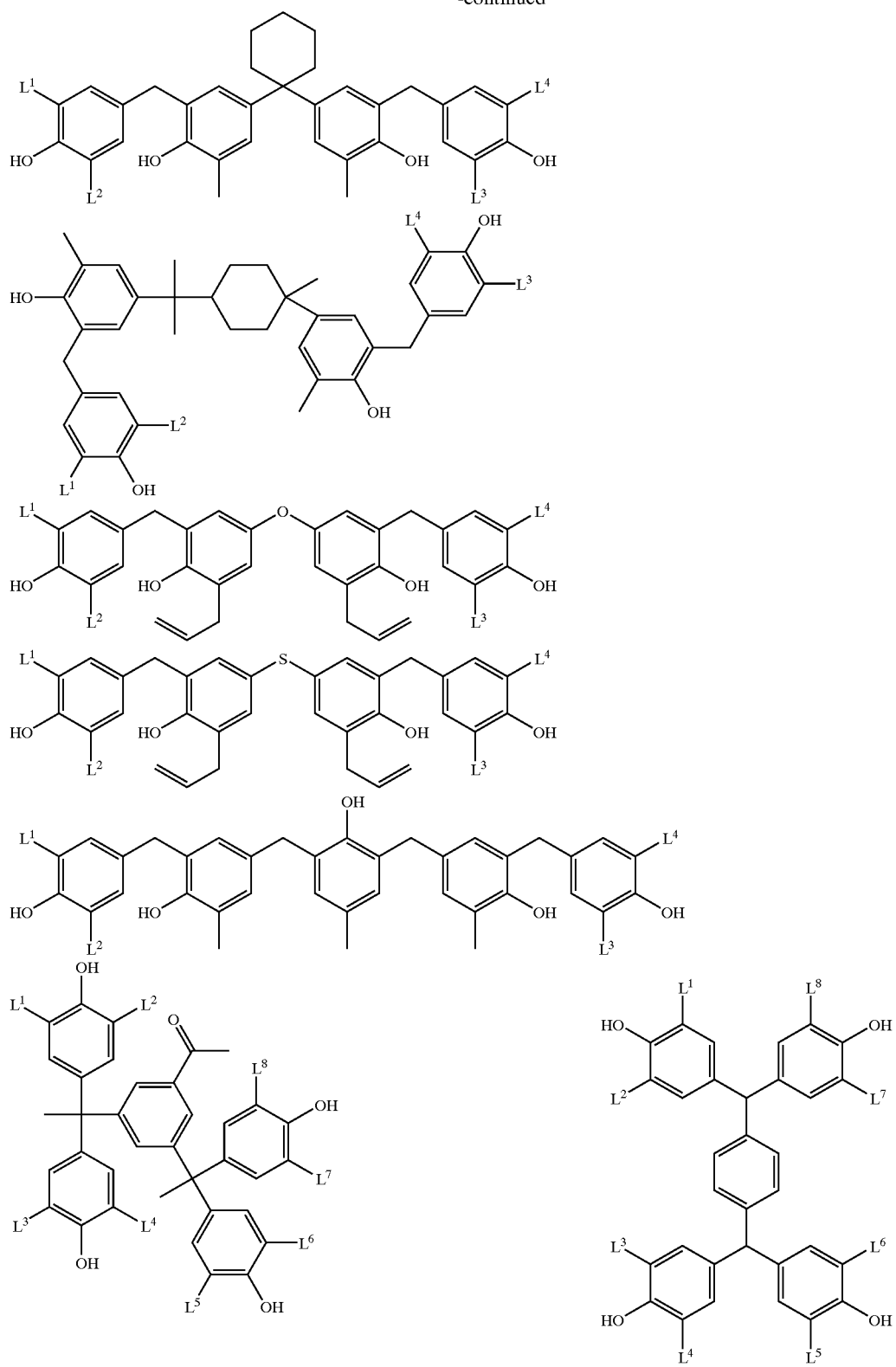

In the above formulae, $L^1$ to $L^8$ are the same or different and each represents a hydroxymethyl group, a methoxymethyl group or an ethoxymethyl group.

A phenol derivative having hydroxymethyl group can be obtained by reacting a corresponding phenol compound free from hydroxymethyl group (a compound represented by one of the above formulae wherein $L^1$ to $L^8$ represent hydrogen atoms) with formaldehyde in the presence of a base catalyst. In this case, it is preferable that the reaction is carried out at a temperature of 60° C. or below to prevent resinification or gelation. More particularly speaking, such a compound can be synthesized by the methods described in JP-A-6-282067, JP-A-7-64285, etc.

A phenol derivative having alkoxymethyl group can be obtained by reacting a corresponding phenol derivative having hydroxymethyl group with an alcohol in the presence of an acid catalyst. In this case, it is preferable that the reaction is carried out at a temperature of 100° C. or below to prevent resinification or gelation. More particularly speaking, such a compound can be synthesized by the methods described in EP 632003A1, etc.

The phenol derivatives having hydroxymethyl or alkoxymethyl groups thus synthesized are preferable from the viewpoint of the stability during storage. In particular, phenol derivatives having alkoxymethyl groups are preferable from the viewpoint of the stability during storage.

It is possible to use either one of these phenol derivatives having 2 or more hydroxymethyl or alkoxymethyl groups in total, wherein these hydroxymethyl groups or alkoxymethyl groups are all attached to a benzene ring or distributed, or a combination of two or more thereof.

In addition to the phenol derivatives as described above, use can be made of the following compounds (i) and (ii) as the crosslinking agent:

(i) compounds having N-hydroxymethyl, N-alkoxymethyl or N-acyloxymethyl groups; and (ii) epoxy compounds.

Next, these crosslinking agents will be illustrated in greater detail.

(i) As the compounds having N-hydroxymethyl, N-alkoxymethyl or N-acyloxymethyl groups, citation may be made of the monomers, oligomer-melamine-formaldehyde condensation products and urea-formaldehyde condensation products disclosed in EP-A 0,133,216 and Western Germany Patents 3,634,671 and 3,711,264 and alkoxylated compounds and benzoguanamine-formaldehyde condensation products disclosed in EP-A 0,212,482, etc.

Still preferable examples thereof include melamine-formaldehyde derivatives having at least two free N-hydroxymethyl, N-alkoxymethyl or N-acyloxymethyl groups. Among all, N-alkoxymethyl derivatives are particularly preferable.

(ii) As the epoxy compounds, citation may be made of epoxy monomer, dimer, oligomer and polymer compounds containing at least one epoxy group. Examples thereof include reaction products of bisphenol A with epichlorhydrin, and reaction products of low-molecular weight phenol-formaldehyde resin with epichlorhydrin. It is also possible to use epoxy resins employed in the art which are disclosed in U.S. Pat. No. 4,026,705 and British Patent 1,539,192, etc.

It is preferable in the invention to use the above-described phenol derivatives.

It is also possible to use other crosslinking agents such as those of the above (i) and (ii), in addition to the phenol derivatives as described above.

The content expressed in molar ratio of other crosslinking agent(s), which may be used in addition to the above-described phenol derivatives, is from 0/100 to 80/20, preferably from 10/90 to 60/40 and still preferably from 20/80 to 50/50.

The crosslinking agent is used in an amount of from 3 to 70% by weight, preferably from 5 to 50% by weight, based on the solid content of the whole negative resist composition. In case where the content of the crosslinking agent is less than 30% by weight, the film residual rate is lowered. It is also unpreferable that the content thereof exceeds 70% by weight, since the resolution is worsened and the storage stability of the resist solution is lowered in this case.

[4] Solvents Employed in the Invention

In the composition according to the invention, the above-described components are each dissolved in solvents and then applied on a base material.

The positive photoresist composition according to the invention contains a solvent mixture (D).

The component (D) is a solvent mixture containing:

at least one member selected propylene glycol monoalkyl ether carboxylate (which are also called the solvents of the group A);

at least one member selected from among propylene glycol monoalkyl ether, alkyl lactate, acetic ester, chain ketone and alkyl alkoxypropionate (which are also called the solvents of the group B); and/or γ-butyrolactone, ethylene carbonate and propylene carbonate (which are also called the solvents of the group C).

As the component (D), therefore, use is made of a combination of solvents of the groups A and B, a combination of solvents of the groups A and C, or a combination of solvents of the groups A, B and C.

As the propylene glycol monoalkyl ether carboxylates, use can be preferably made of propylene glycol monomethyl ether acetate, propylene glycol monomethyl ether propionate, propylene glycol monoethyl ether acetate and propylene glycol monoethyl ether propionate.

As the propylene glycol monoalkyl ethers, use can be preferably made of propylene glycol monomethyl ether and propylene glycol monoethyl ether.

As the alkyl lactates, use can be preferably made of methyl lactate and ethyl lactate.

As the acetic ester, use can be preferably made of butyl acetate, pentyl acetate and hexyl acetate and butyl acetate is still preferable.

As the chain ketones, citation can be made of heptanones. As the heptanones, use can be preferably made of 2-heptanone, 3-heptanone and 4-heptanone and 2-heptanone is still preferable.

As the alkyl alkoxypropionates, use can be preferably made of ethyl 3-ethoxypropionate, methyl 3-methoxypropionate, ethyl 3-methoxypropionate and methyl 3-ethoxypropionate.

The weight ratio of the solvent of the group A and the solvent of the group B (A:B) preferably ranges from 90:10 to 15:85, still preferably from 85:15 to 20:80 and still preferably from 80:20 to 25:75.

The weight ratio of the solvent of the group A and the solvent of the group C (A:C) preferably ranges from 99.1:0.1 to 75:25, still preferably from 99:1 to 80:20 and still preferably from 97:3 to 85:15.

In case of combining solvents of these three types, it is preferable that a solvent of the group C is used at a weight ratio of from 0.1 to 25% by weight, preferably from 1 to 20% by weight and still preferably from 3 to 17% by weight, based on the total solvents.

In the invention, it is preferable that the solid matters of the resist composition containing the above-described components are dissolved in the solvent mixture as described above to give a solid concentration of from 3 to 25% by weight, still preferably from 5 to 22% by weight and still preferably from 7 to 20% by weight.

In the composition according to the invention, the above-described components are each dissolved in the solvent mixture of the component (D) and then applied on abase material. In the invention, other appropriate solvents may be added to the solvent mixture of the component (D). Preferable examples of such solvents include ethylene dichloride, cyclohexanone, cyclopentanone, ethylene glycol monomethyl ether, ethylene glycol monoethyl ether, 2-methoxyethyl acetate, ethylene glycol monoethyl ether acetate, toluene, methyl pyruvate, ethyl pyruvate, propyl pyruvate, N,N-dimethylformamide, N,N-dimethylacetamide, dimethyl sulfoxide, N,N,N',N'-tetramethyl urea, N-methylpyrrolidone, tetrahydrofuran, methyl β-methoxyisobutyrate, ethyl butyrate and propyl butyrate. One or more of these solvent may be mixed with the solvent mixture of the component (d). These solvents are usually added in an amount of 100 parts by weight or less per 100 parts by weight of the solvent mixture of the component (D).

[5] Other Components Employed in the Composition of the Invention

The negative resist composition according to the invention may further contain organic basic compounds, surfactants, dyes, etc., if necessary.

1. Organic Basic Compound

Preferable examples of the organic basic compounds usable in the invention are compounds having a higher basicity than phenol. It is particularly preferable to use basic compounds containing nitrogen.

From the viewpoint of chemical environment, it is preferable to use basic compounds containing nitrogen which have the structures (A) to (E) as shown below.

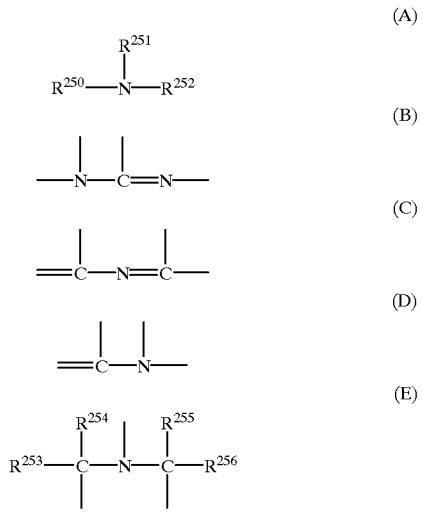

In the above formulae, $R^{250}$, $R^{251}$ and $R^{252}$ may be the same or different and each represents a hydrogen atom, an alkyl group having 1 to 6 carbon atoms, an aminoalkyl group having 1 to 6 carbon atoms, a hydroxalkyl group having 1 to 6 carbon atoms or a substituted or unsubstituted aryl group having 6 to 20 carbon atoms, or $R^{251}$ and $R^{252}$ may be bonded to each other to form together a ring.

$R^{253}$, $R^{254}$, $R^{255}$ and $R^{256}$ may be the same or different and each represents an alkyl group having 1 to 6 carbon atoms.

It is still preferable to use compounds having two or more nitrogen atoms, which are different from each other in chemical environment, per molecule. It is still preferable to use compounds containing both of a substituted or unsubstituted amino group and a nitrogen atom or compounds having an alkylamino group.

Preferable examples of these compounds include substituted or unsubstituted guanidine, substituted or unsubstituted aminopyridine, substituted or unsubstituted aminoalkyl pyridine, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperidine, substituted or unsubstituted aminomorpholine and substituted or unsubstituted aminoalkylmorpholine. Preferable examples of the substituents include amino, aminoalkyl, alkylamino, aminoaryl, arylamino, alkyl, alkoxy, acyl, acyloxy, aryl, aryloxy, nitro, hydroxyl and cyano groups.

Particularly preferable examples of these compounds include guanidine, 1,1-dimethylguanidine, 1,1,3,3,-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 3-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine, though the invention is not restricted thereto.

Either one of these basic compounds containing nitrogen or a combination of two or more thereof may be used. It is preferable that the molar ratio of the acid-generating agent to the organic basic compound (acid-generating agent/ organic basic compound) in the composition is from 2.5 to 300. In case where this molar ratio is less than 2.5, only a poor sensitivity is established and thus the resolution power is sometimes worsened. When this molar ratio exceeds 300, on the other hand, the resist pattern is sometimes largely thickened within the period of time after the exposure till the heating. The molar ratio of acid-generating agent/organic basic compound preferably ranges from 5.0 to 200, still preferably from 7.0 to 150. Addition of such a basic compound containing nitrogen achieves an effect of improving the standing stabilities with time (PCD stability and PED stability) of a resist film.

The term "PCD (Post Coating Delay) stability" as used herein means the stability of a coating film which is formed by applying a resist composition to a substrate and then allowed to stand either in an irradiation apparatus or outside thereof. On the other hand, the term "PED (Post Exposure Delay) stability" as used herein means the stability of a coating film which is radiated and then allowed to stand either in a irradiation apparatus or outside thereof till heating.

2. Surfactants

The negative resist composition according to the invention may contain surfactants. Particular examples of the surfactants include nonionic surfactants, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate, fluorinated surfactants such as Eftop EF301, EF303 and EF352 (manufactured by Shin Akita Kasei K.K.), MEGAFAC F171 and F173 (manufactured by Dainippon Ink and Chemicals, Inc.), FLORAD FC430 and FC431 (manufactured by Sumitomo 3M Inc.), ASAHIGARD AG710 and SURFLON S-382, SC101, SC102, SC103, SC104, SC105 and SC106 (manufactured by Asahi Glass Co., Ltd.), Organosiloxane polymer KP341 (manufactured by Shin-Etsu Chemical Industry Co., Ltd.), acrylic acid or methacrylic acid (co)polymers POLYFLOW No.75 and No.95 (manufactured by Kyoei Yushi Kagaku Kogyo K.K.) and TROYSOLS-366 (manufactured by Troy Chemical Industries Inc.).

It is preferable to use at least one surfactant containing at least one of a fluorine atom and silicone atom. It is also preferable to use a surfactant having both of fluorine and silicon atoms. Examples of such surfactants include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. No. 5,405,720, U.S. Pat. No. 5,360,692, U.S. Pat. No. 5,529,881, U.S. Pat. No. 5,296,330, U.S. Pat. No. 5,436,098, U.S. Pat. No. 5,576,143, U.S. Pat. No. 5,296,143, U.S. Pat. No. 5,294,511 and U.S. Pat. No. 5,824,451. It is also possible to use the following marketed surfactants as such. Namely, examples of the marketed surfactants include fluorinated surfactants and silicone surfactants such as Eftop EF301 and EF303 (manufactured by Shin Akita Kasei K.K.), FLORAD FC430 and FC431 (manufactured by Sumitomo 3M Inc.), MEGAFAC F171, F173, F176, F189 and R08 (manufactured by Dainippon Ink and Chemicals, Inc.), SURFLON S-382, SC101, 102, 103, 104, 105 and 106 (manufactured by Asahi Glass Industry Inc.), and TROYSOL S-366 (manufactured by Troy Chemical Industries Inc.). Organosiloxane polymer KP341 (manufactured by Shin-Etsu Chemical Co., Ltd.) is also usable as a silicone surfactant.

These surfactants are used in an amount of usually from 0.001 to 2 parts by weight, preferably from 0.01 to 1 part by weight, per 100 parts by weight of the solid matters in the composition according to the invention. Either one of these surfactants or a combination of several of thereof may be used. Addition of these surfactants exerts effects of elevating the in-plane uniformity of a resist film and improve the resolution.

3. Dyes

Appropriate dyes include oily dyes and basic dyes. More particularly speaking, citation maybe made of Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industries, Ltd.), Crystal Violet (CI42555), Methyl Violet (CI42535), Rhodamine B (CI45170B), Malachite Green (CI42000), Methylene Blue (CI52015), etc.

To form a pattern on a resist film in producing a fine integrated circuit device or the like, the negative resist composition according to the invention is applied on a substrate (e.g., silicone/silicone dioxide coating, transparent substrate such as glass substrate or ITO substrate) and then irradiated with an electron beam or X-ray imaging apparatus followed by heating, development, rinsing and drying. Thus, a preferable resist pattern can be formed.

As a developing solution for the negative resist composition according to the invention, use can be made of aqueous solutions of alkalis, for example, inorganic alkalis such as sodiumhydroxide, potassiumhydroxide, sodiumcarbonate, sodium silicate, sodium metasilicate and ammonia, primary amines such as ethylamine and n-propylamine, secondary amines such as diethylamine and di-n-butylamine, tertiary amines such as triethylamine and methyldiethylamine, alcohol amines such as dimethylethanol amine and triethanol amine, quaternary ammonium salts such as tetramethylammonium hydroxide, tetraethylammonium hydroxide and choline, and cyclic amines such as pyrrole and piperidine. It is also possible to add an appropriate amount of alcohols such as isopropyl alcohol or surfactants such as nonionic surfactants to the above-described aqueous alkali solutions.

Among these developing solutions, it is preferable to use quaternary ammonium salts, still preferably tetramethylammonium hydroxide or choline.

Now, the invention will be illustrated in greater detail by reference to the following examples. However, it is to be understood that the invention is not construed as being restricted thereto.

1. Examples of the Synthesis of Component Materials (1) Alkali-Soluble Resin 1) 17.6 g of 3-t-butoxystyrene was added to 27 g of dry THF and then heated to 70° C. under a nitrogen gas stream. When the reaction temperature became stable, an azo-type radical initiator V-601 (manufactured by Wako Pure Chemical Industries, Ltd.) was added thereto in an amount of 2% by mol based on the above monomer to thereby initiate the reaction. After reacting for 3 hours, 2% by mol of V-601 was added again and the reaction was continued for 3 hours. The reaction mixture was diluted with THF and poured into a large amount of methanol. The polymer thus precipitated was decomposed in the presence of a hydrochloric acid acidic solution in a conventional manner and precipitated from hexane. After repeating the precipitation and purification procedures twice, the polymer was dried under reduced pressure to thereby give a polymer (P-1). Then the molecular weight (Mw: in terms of polystyrene) and the molecular weight distribution (Mw/Mn) of the polymer were determined by GPC analysis with the use of THF as a solvent.

2) Polymers (P-2) to (P-4), (P-6), (P-7) and (P-11) were obtained almost in the same manner but using other monomers.

3) 16.2 g of 3-acetoxystyrene was added to 24 g of dry THF and then heated to 70° C. under a nitrogen gas stream. When the reaction temperature became stable, an azo-type radical initiator V-601 (manufactured by Wako Pure Chemical Industries, Ltd.) was added thereto in an amount of 2% by mol based on the above monomer to thereby initiate the reaction. After reacting for 3 hours, 2% by mol of V-601 was added again and the reaction was continued for 3 hours. The reaction mixture was diluted with THF and poured into a large amount of methanol. The polymer thus precipitated was hydrolyzed in the presence of a solution under basic conditions in a conventional manner and precipitated from hexane. After repeating the precipitation and purification procedures twice, the polymer was dried under reduced pressure to thereby give a polymer (P-5).

4) 12 g of the polymer (P-1) obtained as in the above 1) dissolved in dry propylene glycol monomethyl ether acetate.

1.0 g of β-cyclohexylethylvinyl ether and 10 mg of p-toluenesulfonic acid were added thereto. After stirring the mixture at room temperature for 1 hour, triethylamine was added.

The liquid reaction mixture was poured into water and the powder thus precipitated was collected by filtering and dried under reduced pressure to give a polymer (P-9).

5) Polymers (P-8) and (P-10) were obtained by methods similar to the one of the above-described 5) with the use of corresponding reagents.

6) 11.3 g of 3-hydroxystyrene and 5.3 g of 4-t-butoxystyrene were added to 30 g of dry THF and then heated to 70° C. under a nitrogen gas stream. When the reaction temperature became stable, an azo-type radical initiator V-601 (manufactured by Wako Pure Chemical Industries, Ltd.) was added thereto in an amount of 2% by mol based on the above monomers to thereby initiate the reaction. After reacting for 3 hours, 2% by mol of V-601 was added again and the reaction was continued for 3 hours. The reaction mixture was diluted with THF and poured into a large amount of methanol to thereby precipitate a polymer. After repeating the precipitation and purification procedures twice, the polymer was dried under reduced pressure to thereby give a polymer (P-12).

7) A polymer (p-13) was obtained in the same manner as in the above 6).

8) 17.6 g of 3-t-butoxystyrene was subjected to living anion polymerization in degassed dry THF at −78° C. by using s-butyllithium as an initiator. After reacting for 3 hours, the reaction was ceased by using degassed methanol. Then, the reaction mixture was poured into a large amount of methanol. The powder thus precipitated was collected by filtering and dried under reduced pressure to give a resin. After repeating the precipitation and purification procedures twice, t-butoxy group of this resin was decomposed under acidic conditions with the use of hydrochloric acid in a conventional manner to give a polymer (P-21).

9) A polymer (P-22) was obtained in the same manner but regulating the amount of the initiator.

10) Polymers (P-23) to (P-28) were obtained as in the same manner as in the above-described 8) but using respectively 10, 20 and 30% by weight of 4-t-butoxystyrene as a monomer and regulating the amount of the initiator.

11) A polymer was obtained in the same manner as in the above-described 1) but using a mixture of 3-t-butoxystyrene/4-t-butoxystyrene (60/40, by weight) as a starting monomer material. Then this polymer was subjected to fractional precipitation from a dilute acetone solution to give a polymer (P-29).

12) A polymer (P-30) was obtained in the same manner as in 11) but regulating the amount of the initiator.

13) Polymers (P-31) and (P-32) were obtained in the same manner as in 8) but substituting 20% by mol of the monomer by 3,4-di-t-butoxystyrene and regulating the amount of the initiator.

14) Polymers (P-33), (P-34) and (P-37) to (P-40) were obtained by protecting polymers, which were obtained in the same manner as in 8) but regulating the amount of the initiator, each in a conventional manner.

15) Polymers (P-35), (P-36) and (P-41) to (P-44) were obtained in the same manner as in 8) but substituting a portion of the monomer and regulating the amount of the initiator as in the above-described 10).

|  |  | Mw | Mw/Mn |
|---|---|---|---|
| P-1 | [3-hydroxystyrene homopolymer, 100] | 10,000 | 1.7 |
| P-2 | [3-hydroxystyrene/4-hydroxystyrene copolymer, 90/10] | 8,000 | 1.8 |
| P-3 | [3-hydroxystyrene/4-hydroxystyrene copolymer, 60/40] | 12,000 | 2.0 |

| | Mw | Mw/Mn |
|---|---|---|
| P-4 | 9,000 | 2.2 |
| P-5 | 10,000 | 1.9 |
| P-6 | 13,000 | 2.3 |
| P-7 | 15,000 | 2.3 |
| P-8 | 11,000 | 1.8 |
| P-9 | 10,000 | 2.0 |
| P-10 | 18,000 | 2.1 |

-continued
| | | Mw | Mw/Mn |
|---|---|---|---|
| P-11 | 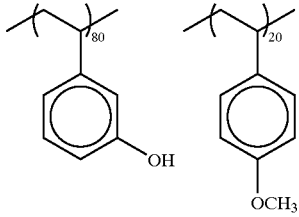 | 20,000 | 1.9 |
| P-12 | 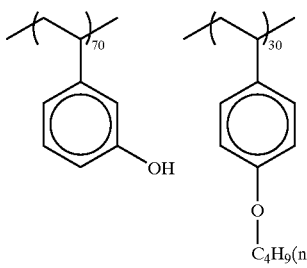 | 16,000 | 1.6 |
| P-13 | 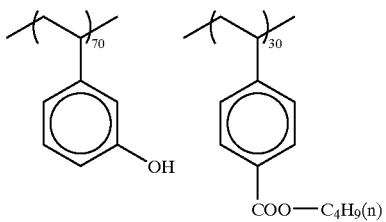 | 14,000 | 1.8 |
| P-21 | 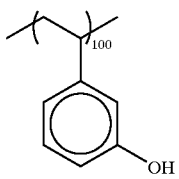 | 5,500 | 1.1 |
| P-22 | 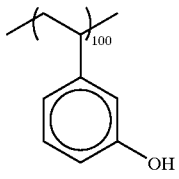 | 11,000 | 1.1 |
| P-23 | 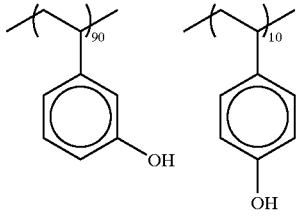 | 7,000 | 1.1 |
| P-24 | 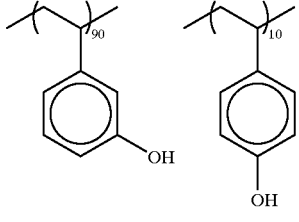 | 13,000 | 1.1 |

-continued

| | | Mw | Mw/Mn |
|---|---|---|---|
| P-25 | (m-OH phenyl)₈₀ (p-OH phenyl)₂₀ | 8,000 | 1.2 |
| P-26 | (m-OH phenyl)₈₀ (p-OH phenyl)₂₀ | 15,000 | 1.2 |
| P-27 | (m-OH phenyl)₇₀ (p-OH phenyl)₃₀ | 8,500 | 1.3 |
| P-28 | (m-OH phenyl)₇₀ (p-OH phenyl)₃₀ | 16,000 | 1.3 |
| P-29 | (m-OH phenyl)₆₀ (p-OH phenyl)₄₀ | 9,000 | 1.35 |
| P-30 | (m-OH phenyl)₆₀ (p-OH phenyl)₄₀ | 17,000 | 1.35 |

-continued
| | | Mw | Mw/Mn |
|---|---|---|---|
| P-31 | 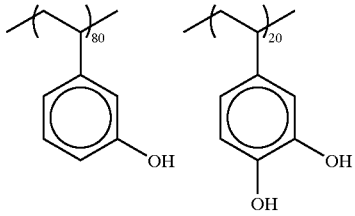 | 4,500 | 1.1 |
| P-32 | 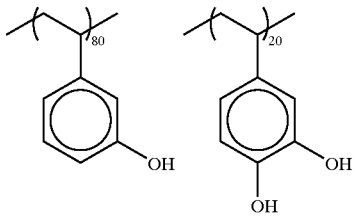 | 10,000 | 1.1 |
| P-33 | 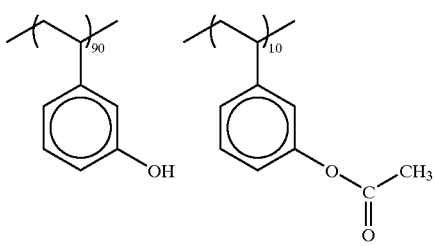 | 3,000 | 1.1 |
| P-34 | 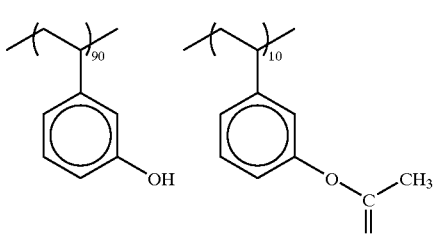 | 6,000 | 1.1 |
| P-35 | 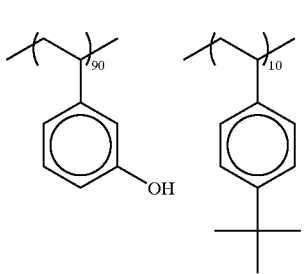 | 3,200 | 1.2 |
| P-36 | 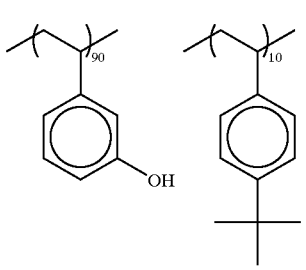 | 6,500 | 1.2 |

-continued
| | Mw | Mw/Mn |
|---|---|---|
| P-37 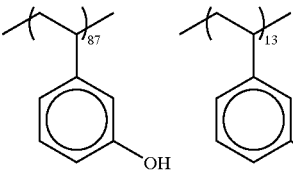 | 2,700 | 1.1 |
| P-38 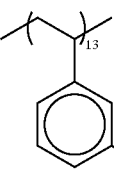 | 5,500 | 1.1 |
| P-39 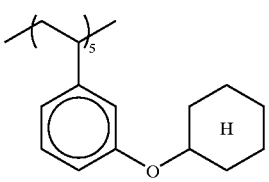 | 2,300 | 1.1 |
| P-40 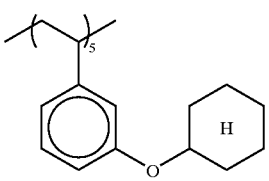 | 4,800 | 1.1 |
| P-41 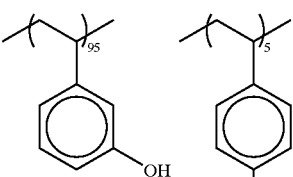 | 2,100 | 1.2 |
| P-42 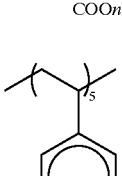 | 4,300 | 1.2 |
| P-43 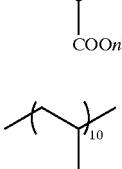 | 3,800 | 1.1 |

| | Mw | Mw/Mn |
|---|---|---|
| P-44 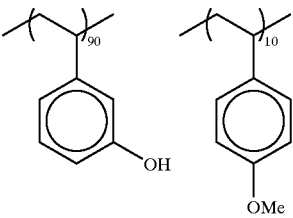 | 7,700 | 1.1 |

(2) Acid-Generating Agent

1) Synthesis of Tetramethylammonium Pentafluorobenzenesulfonate 25 g of pentafluorobenzenesulfonyl chloride was dissolved in 100 ml of methanol under ice-cooling. Then 100 g of a 25% aqueous solution of tetramethylammonium hydroxide was slowly added thereto. By stirring at room temperature for 3 hours, a solution of tetramethylammonium pentafluorobenzenesulfonate was obtained. Thus solution was employed in salt exchange between sulfonium salt and iodonium salt.

2) Synthesis of Triphenylsulfonium Pentafluorobenzenesulfonate 50 g of diphenyl sulfoxide was dissolved in 800 ml of benzene. After adding 200 g of aluminum chloride, the resultant mixture was refluxed for 24 hours. Then the liquid reaction mixture was slowly poured into 2 L of ice. After adding 400 ml of conc. Hydrochloric acid, the mixture was heated to 70° C. for 10 minutes. The obtained aqueous solution was washed with 500 ml of ethyl acetate and filtered. Then 200 g of ammonium iodide dissolved in 400 ml of water was added thereto. The powder thus precipitated was collected by filtering, washed successively with water and ethyl acetate and dried to give 70 g of triphenylsulfonium iodide.

30.5 g of the triphenylsulfonium iodide was dissolved in 1,000 ml of methanol. 19.1 g of silver oxide was added to this solution and the mixture was stirred at room temperature for 4 hours. The solution was filtered and a solution of tetramethylammonium pentafluorobenzenesulfonate in excess was added thereto. The liquid reaction mixture was concentrated and then dissolved in 500 ml of dichloromethane. The obtained solution was washed with a 5% aqueous teteramethylammonium hydroxide solution and water. The organic phase was dried and concentrated over anhydrous sodium sulfate to give triphenylsulfonium pentafluorobenzenesulfonate (I-1).

3) Synthesis of Di(4-t-amylphenyl)iodonium pentafluorobenzenesulfonate 60 g of t-amylbenzene, 39.5 g of potassium iodate, 81 g of acetic anhydride and 170 ml of dichloromethane were mixed together. Then 66.8 g of conc. sulfuric acid was slowly added dropwise thereinto under ice-cooling. After stirring under ice-cooling for 2 hours, the mixture was stirred at room temperature for additional 10 hours. 500 ml of water was added to the liquid reaction mixture under ice-cooling and the mixture was extracted with dichloromethane. The organic phase was washed with sodium hydrogencarbonate and water and then concentrated to give (4-t-amylphenyl)iodonium sulfate. This sulfate was added to a solution of tetramethylammonium pentafluorobenzenesulfonate in excess. After adding 500 ml of water, the solution was extracted with dichloromethane. Then the organic phase was washed with a 5% aqueous solution of tetramethylammonium hydroxide and water and then concentrated to give di(4-t-amylphenyl)iodonium pentafluorobenzenesulfonate (III-1).

Other compounds can be synthesized by methods similar to the above-described ones.

(3) Crosslinking Agent

Synthesis of Crosslinking Agent [HM-1]

20 g of 1-[α-methyl-α-(4-hydroxyphenyl)ethyl]-4-[α,α-bis(4-hydroxyphenyl)ethyl]benzene (Trisp-PA manufactured by Honshu Chemical Industry Co., Ltd.) was added to a 10% aqueous solution of potassium hydroxide and dissolved by stirring. While stirring this solution, 60 ml of a 37% aqueous solution of formalin was slowly added thereto at room temperature. After stirring at room temperature for additional 6 hours, the mixture was poured into an aqueous solution of dilute sulfuric acid. The precipitate was collected by filtering, thoroughly washed with water and then recrystallized from 30 ml of methanol to thereby give 20 g of a white powder of a phenol derivative having hydroxymethyl groups [HM-1] as shown below. The purity of the product was 92% (determined by liquid chromatography).

[HM-1]

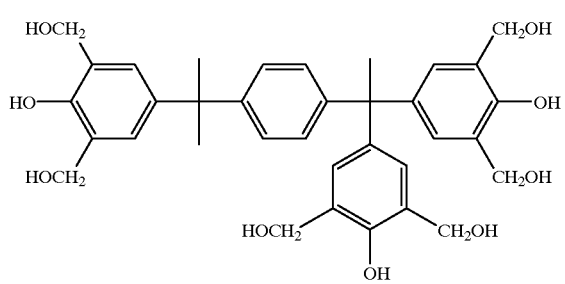

Synthesis of Crosslinking Agent [MM-1]

20 g of the phenol derivative [MM-1] having hydroxymethyl groups obtained in the above synthesis example was added to 1 L of methanol and dissolved therein by heating and stirring. After adding 1 ml of conc. hydrochloric acid, this solution was heated under reflux for 12 hours. After the completion of the reaction, the liquid reaction mixture was cooled and 2 g of potassium carbonate was added. The resultant mixture was sufficiently concentrated and then 300 ml of ethyl acetate was added thereto. The solution was washed with water and concentrated to dryness to thereby give 22 g of a phenol derivative having methoxymethyl groups as shown in the following structure as a white solid. The purity of this product was 90% (determined by liquid chromatography).

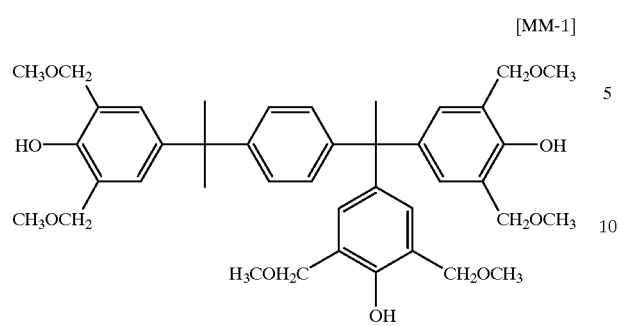
[MM-1]
The following phenol derivatives were synthesized in the same manner.
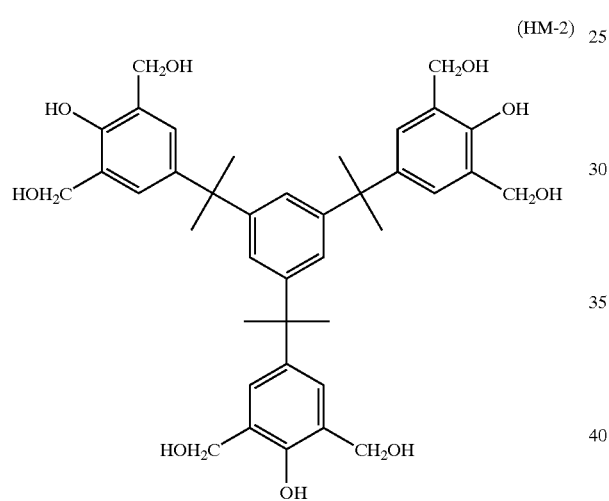
(HM-2)
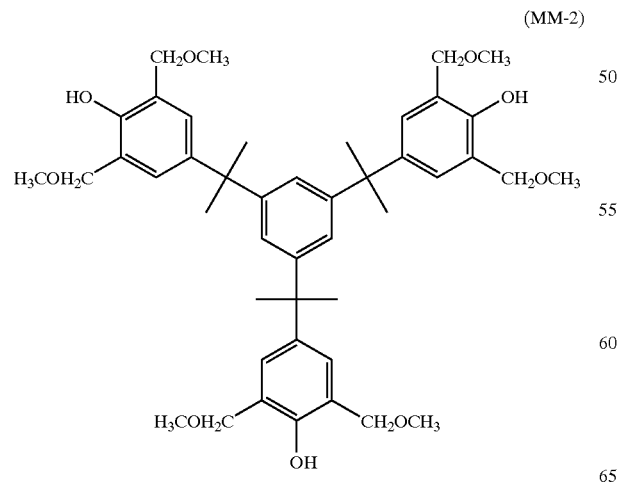
(MM-2)
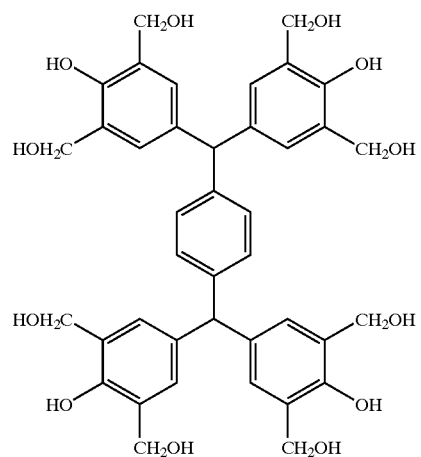
(HM-3)
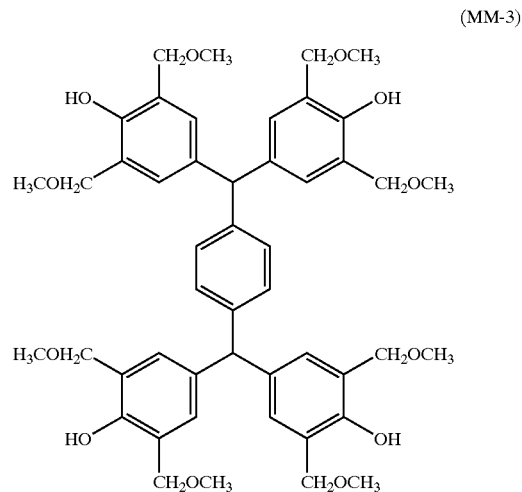
(MM-3)
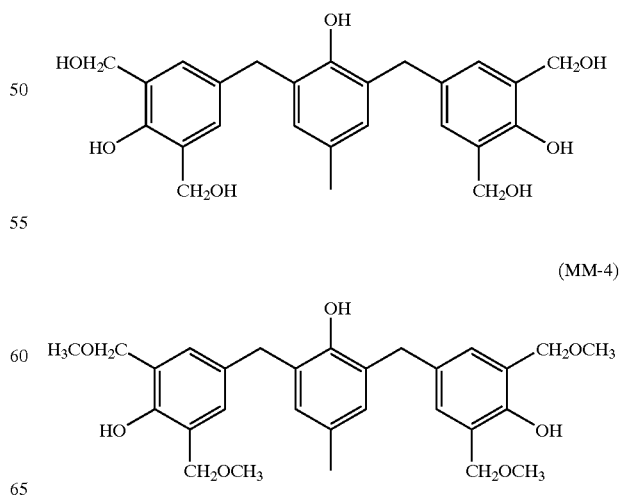
(HM-4)
(MM-4)

-continued

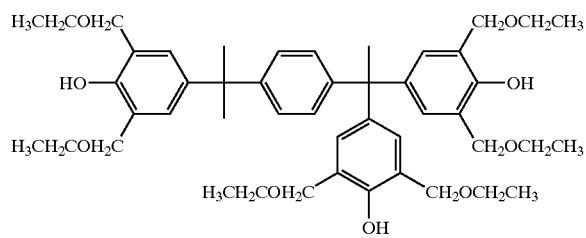
(MM-5)

2. Example (1) Coating of Resist

Photoresist composition solutions having the composition as shown in Table 1 were prepared by using compounds constituting the invention selected form among the synthesis examples as described above or comparative compounds.

Each sample solution was filtered through a 0.1 μm filter, then coated on a silicone wafer by using a spin coater and dried on a vacuum suction hot plate at 110° C. for 90 seconds to thereby give a resist film of 0.3 μm in film thickness.

<Acid-Generating Agent>

PAG-1: $Ph_3S^+$ $CF_3SO_3^-$

PAG-2:

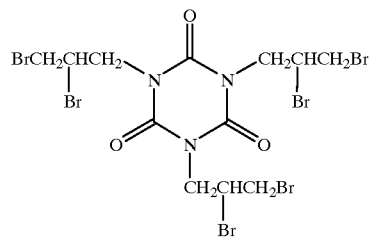

TABLE 1

| | Resin (0.98 g) | Acid-generating Agent (0.06 g) | Crosslinking Agent (0.31 g) | Organic basic compound (0.0018 g) | Surfactant (100 ppm*) | Solvent (8.65 g) |
|---|---|---|---|---|---|---|
| Ex. 1 | P-1 | I-1 | MM-1 | 1 | S-1 | a1/b4 = 80/20 |
| Ex. 2 | P-2 | I-2 | MM-4 | " | " | a1/b5 = 70/30 |
| Ex. 3 | P-4 | I-7 | MM-3 | no | " | a1/b1 = 60/40 |
| Ex. 4 | P-6 | I-8 | CL-1 | 1 | " | a1/c3 = 95/5 |
| Ex. 5 | P-7 | I-9 | MM-2 | " | " | a1/c1 = 93/7 |
| Ex. 6 | P-9 | II-1 | MM-3 | " | " | a1/c2 = 90/10 |
| Ex. 7 | P-11 | II-4 | MM-1 | " | " | a2/b4 = 80/20 |
| Ex. 8 | P-12 | III-1 | CL-2 | no | " | a2/b5 = 70/30 |
| Ex. 9 | P-21 | III-3 | MM-4 | 1 | " | a2/c1 = 95/5 |
| Ex. 10 | P-23 | I-1 | MM-1 | " | " | a1/b4/c1 = 75/20/5 |
| Ex. 11 | P-33 | II-2 | MM-3 | " | " | a1/b4/c2 = 80/15/5 |
| Ex. 12 | P-38 | III-2 | MM-2 | " | " | a1/b4/c3 = 72/20/8 |
| Ex. 13 | P-40 | PAG-1 | MM-4 | " | " | a1/b1/c1 = 70/25/5 |
| Ex. 14 | P-41 | PAG-2 | MM-3 | " | " | a1/b1/c2 = 75/20/5 |
| Ex. 15 | Polymer-1 | I-2 | MM-1 | " | " | a1/b1/c3 = 72/20/8 |
| Ex. 16 | Polymer-2 | II-1 | MM-2 | " | " | a2/b4/c1 = 65/30/5 |
| C. Ex. 1 | Polymer-1 | PAG-1 | MM-1 | 1 | S-1 | a1 |
| C. Ex. 2 | Polymer-2 | I-1 | CL-1 | " | " | a1 |

*Based on solid matters.

The meanings of the symbols employed in Table 1 are as follows.

<Resin>

Polymer-1: poly(p-hydroxystyrene)

Mw=10,000, Mw/Mn=1.4

Polymer-2: novolak resin m-cresol/p-cresol=45/55 (by mol)

Mw=6,500

(Crosslinking Agent)

CL-1:

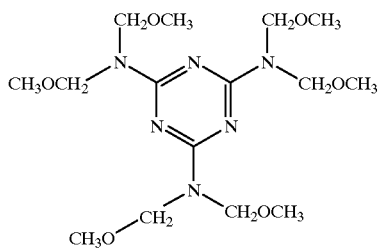

CL-2:

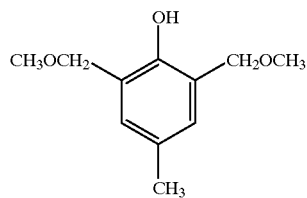

The solvents employed are as follows.
a1: propylene glycol monomethyl ether acetate.
a2: propylene glycol monomethyl ether propionate.
b1: ethyl lactate.
b2: butyl acetate.
b3: 2-heptanone.
b4: propylene glycol monomethyl ether.
b5: ethyl 3-ethoxypropionate.
c1: γ-butyrolactone.
c2: ethylene carbonate.
c3: propylene carbonate.

The organic basic compounds employed are as follows.
1: 2,4,5-triphenylimidazole.
2: 1,5-diazabicyclo[4.3.0]nona-5-ene.
3: 4-dimethylaminopyridine.
4: 1,8-diazabicyclo[5.4.0]undeca-7-ene.
5: N-cyclohexyl-N'-morpholinoethyl thiourea.

The surfactant employed are as follows.
S-1: TROYSOL S-366 (manufactured by Troy Chemical Industries Inc.).
S-2: MEGAFAC F176 (manufactured by Dainippon Ink and Chemicals, Inc.).
S-3: MEGAFAC R08 (manufactured by Dainippon Ink and Chemicals, Inc.).
S-4: Polysiloxane Polymer KP-341 (manufactured by Shin-Etsu Chemical Industry Inc.).
S-5: SURFLON S-382 (manufactured by Asahi Glass Co., Ltd.).

(2) Formation of Resist Pattern

These resist films were irradiated with an electron beam imaging apparatus (accelerating voltage: 50 KeV). After the irradiation, each film was heated on a vacuum suction hot plate at 110° C. for 90 seconds, immersed in a 2.38% by weight aqueous solution of tetramethylammonium hydroxide (TMAH) for 60 seconds, rinsed with water for 30 seconds and then dried. The sectional view of the pattern thus obtained was observed under a scanning electron microscope.

The sensitivity was defined as the minimum exposure required in resolving 0.20 μm lines (line:space=1:1) and a limiting resolution (resolution of lines from spaces) at that exposure was referred to as the resolution. In case of a pattern showing no resolution of 0.20 μm lines (line:space=1:1), the limiting resolution power was referred to as the resolution and the exposure at that point was referred to as the sensitivity.

Development defect, coating properties and solubility in solvent were evaluated as follows.

[Development Defect]

Development defects in the resist patterns thus obtained were counted with KLA-2112 (manufactured by KLA-Tenchor) and the primary data thus obtained were referred to as the development defect counts.

[Coating Properties (In-Plane Uniformity)]

Each resist solution was applied on an 8 inch silicone wafer and processed in the same manner as the formation of the resist layers described above to give a resist coating film for evaluating the in-plane uniformity. Then the coating film thickness was measured uniformly at 36 points crosswise along the diameter of the wafer by using Lambda A (manufactured by Dainippon Screen Mfg. Co., Ltd.). The standard deviation (SD) of the data thus obtained was determined and a sample in which the triple value of the SD was less than 50 was evaluated as "A", while a sample in which the triple value of the SD was 50 or more was evaluated as "B".

[Solubility in Solvent]

The solubility in solvent was evaluated on the basis of the initial particle count and the particle gain after storage determined in the following manner. Namely, particles in each negative photoresist composition solution prepared above were counted immediately after the preparation of the solution (i.e., initial particle count) and after allowing to stand at 23° C. for 1 week (particle count after storage) by using a particle counter manufactured by Rion. Evaluation was made on the initial particle count and the particle gain (i.e., (particle count after storage)-(initial particle count)). Particles of 0.3 μm or more per ml of the resist composition solution were counted.

Table 2 shows the evaluation data of the resists listed in Table 1.

TABLE 2

| | Sensitivity ($\mu$/cm$^2$) | Resolution ($\mu$m) | Profile | Development defect | Coating uniformity (un-plane uniformity) | Initial particle count | Particle gain |
|---|---|---|---|---|---|---|---|
| Ex. 1 | 11 | 0.08 | rectangular | 70 | A | 5 | 1 |
| Ex. 2 | 18 | 0.08 | " | 75 | A | 3 | 1 |
| Ex. 3 | 12 | 0.10 | " | 60 | A | 4 | 2 |
| Ex. 4 | 29 | 0.11 | somewhat taper | 80 | A | 7 | 3 |
| Ex. 5 | 21 | 0.09 | rectangular | 63 | A | 3 | 2 |
| Ex. 6 | 25 | 0.09 | " | 74 | A | 4 | 2 |
| Ex. 7 | 23 | 0.08 | " | 58 | A | 5 | 1 |
| Ex. 8 | 29 | 0.13 | somewhat taper | 77 | A | 6 | 2 |
| Ex. 9 | 8 | 0.09 | rectangular | 71 | A | 3 | 0 |
| Ex. 10 | 9 | 0.10 | " | 69 | A | 4 | 1 |
| Ex. 11 | 11 | 0.09 | " | 55 | A | 4 | 2 |
| Ex. 12 | 13 | 0.10 | " | 79 | A | 5 | 1 |
| Ex. 13 | 16 | 0.13 | somewhat taper | 75 | A | 7 | 3 |
| Ex. 14 | 20 | 0.12 | " | 80 | A | 8 | 2 |
| Ex. 15 | 30 | 0.10 | rectangular | 71 | A | 8 | 1 |
| Ex. 16 | 33 | 0.14 | somewhat taper | 68 | A | 9 | 3 |

TABLE 2-continued

|  | Sensitivity ($\mu$/cm$^2$) | Resolution ($\mu$m) | Profile | Development defect | Coating uniformity (un-plane uniformity) | Initial particle count | Particle gain |
|---|---|---|---|---|---|---|---|
| C. Ex. 1 | 37 | 0.20 | taper | 179 | B | 21 | 25 |
| C. Ex. 2 | 45 | 0.22 | " | 431 | B | 25 | 34 |

*: Based on solid matters.

As the results given in Table 2 show, the negative resist compositions according to the invention are superior in all of the properties to the comparative samples.

Samples obtained by substituting the organic basic compound 1 employed in Example by the compounds 2, 3, 4 and 5 achieved each comparable performance.

Samples obtained by substituting the surfactant S-1 employed in Example by the surfactants S-2, S-3, S-4 and S-5 achieved each comparable performance.

<Patterning by Proximity X-Ray Exposure>

By using the resist compositions of Example 1 (Ex. 1) and Comparative Examples 1 and 2 (C. Ex. 1 and 2) as described above, resist films of 0.40 $\mu$m in thickness were obtained in the same manner as in the above Example 1. Then patterning was carried out in the same manner as in the above Example but using a proximity X-ray exposure apparatus (gap; 20 nm) and the resist performance (sensitivity, resolution power and pattern shape) was evaluated in the same manner as in the above Example. Table 3 shows the results.

| Resist composition | Sensitivity ($\mu$C/cm$^2$) | Resolution ($\mu$m) | Pattern shape |
|---|---|---|---|
| Ex. 1 | 95 | 0.09 | rectangular |
| C. Ex. 1 | 140 | 0.16 | inverted taper |
| C. Ex. 2 | 170 | 0.14 | inverted taper |

As Table 3 clearly shows, the resist composition according to the invention shows a very excellent performance when exposed to X-rays too.

The negative resist compositions for electron beams and X-rays of the chemical amplification type according to the invention make it possible to provide negative photosensitive compositions which are excellent in sensitivity and resolution, and have a rectangular profile and excellent properties (development defect, coating properties, i.e., in-plane uniformity in wafer, and solubility in solvent).

What is claimed is:

1. A negative resist composition to be irradiated with one of an electron beam and X ray comprising:

(A) an alkali-soluble resin;

(B) a compound capable of generating an acid upon irradiation with a radiation;

(C) a crosslinking agent capable of crosslinking by the action of an acid; and (D) one of solvent mixtures (DI) and (DII):

(DI) a solvent mixture containing at least one solvent selected from the group A below and at least one solvent selected from the group B below; and (DII) a solvent mixture containing at least one solvent selected from the group A below and at least one solvent selected from the group C below:

group A: a propylene glycol monoalkyl ether carboxylate;

group B: a propylene glycol monoalkyl ether, an alkyl lactate, an acetic ester, a chain ketone and an alkyl alkoxypropionate;

group C: a $\gamma$-butyrolactone, an ethylene carbonate and a propylene carbonate.

2. A negative resist composition to be irradiated with one of an electron beam and X ray comprising:

(A) an alkali-soluble resin;

(B) a compound generating an acid upon irradiation with a radiation;

(C) a crosslinking agent capable of crosslinking by the action of an acid; and (D) a solvent mixture containing: at least one solvent selected from the group A below; at least one solvent selected from the group B below; and at least one solvent selected from the group C below:

group A: a propylene glycol monoalkyl ether carboxylate;

group B: a propylene glycol monoalkyl ether, an alkyl lactate, an acetic ester, a chain ketone and an alkyl alkoxypropionate;

group C: a $\gamma$-butyrolactone, an ethylene carbonate and a propylene carbonate.

3. The negative resist composition as claimed in claim 1, wherein the resin (A) contains a structural unit represented by formula (1):

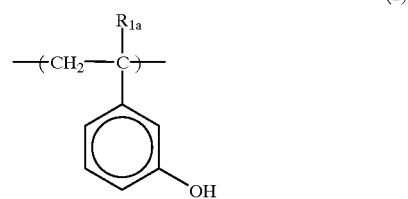

(1)

wherein $R_{1a}$ represents a hydrogen atom or a methyl group.

4. The negative resist composition as claimed in claim 1, wherein the resin (A) is a resin represented by formula (2):

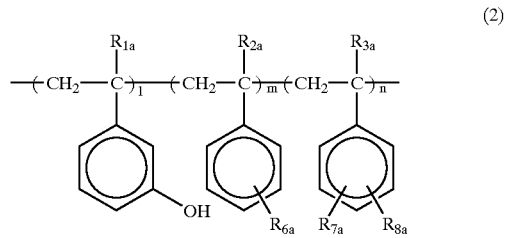

(2)

-continued

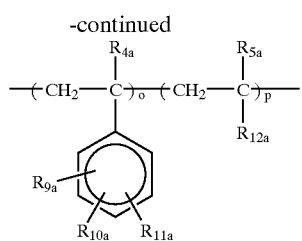

wherein $R_{1a}$ to $R_{5a}$ each independently represents a hydrogen atom or a methyl group; $R_{6a}$ to $R_{11a}$ each independently represents a hydrogen atom, an alkyl group having 1 to 4 carbon atoms, an alkoxy group having 1 to 4 carbon atoms, a hydroxyl group or —C(=O)O—$R_{14a}$; $R_{14a}$ represents a hydrogen atom or an alkyl group having 1 to 4 carbon atoms; $R_{12a}$ represents —COOR$_{15a}$; $R_{15a}$ represents a hydrogen atom or an alkyl group having 1 to 4 carbon atoms; $0<1\leq100$; $0\leq m<100$; $0\leq n<100$; $0\leq o<100$; $0\leq p<100$; and $l+m+n+o+p=100$.

5. The negative resist composition as claimed in claim 1, wherein the compound (B) contains at lease one compound represented by formulae (I) to (III):

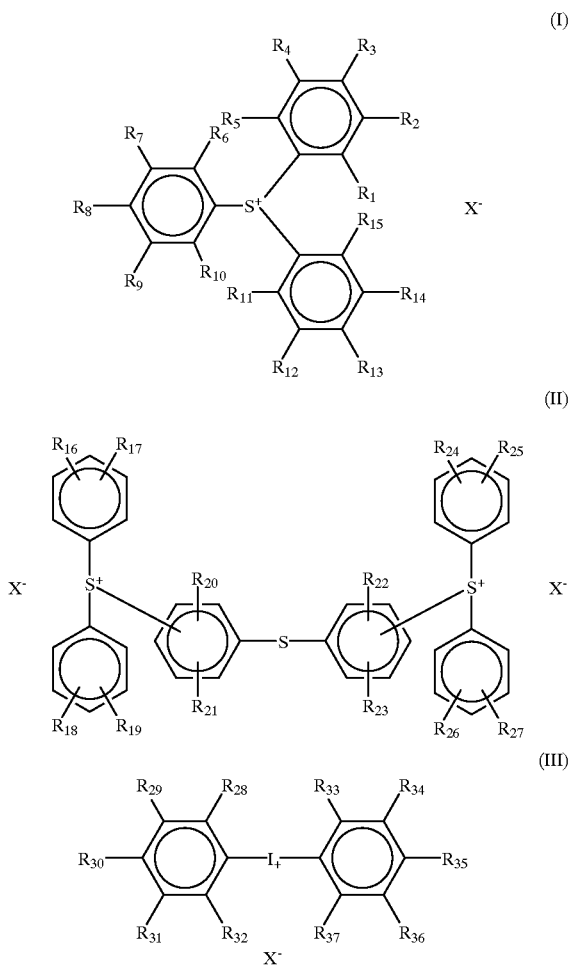

wherein $R_1$ to $R_{37}$ each independently represents a hydrogen atom, an alkyl group, an alkoxyl group, a hydroxyl group, a halogen atom or a group represented by —S—$R_{38}$; $R_{38}$ represents an alkyl group or an aryl group; two or more groups selected from $R_1$ to $R_{15}$ may be bonded to each other, either directly at the ends or mediated by an atom selected from oxygen, sulfur and nitrogen, to thereby form a cyclic structure; two or more groups selected from $R_{16}$ to $R_{27}$ may be bonded to each other, either directly at the ends or mediated by an atom selected from oxygen, sulfur and nitrogen, to thereby form a cyclic structure; two or more groups selected from $R_{28}$ to $R_{37}$ may be bonded to each other, either directly at the ends or mediated by an atom selected from oxygen, sulfur and nitrogen, to thereby form a cyclic structure; and $X^-$ represents an anion of an acid which is selected from a benzenesulfonic acid, naphthalenesulfonic acid and anthracene sulfonic acid and has at least one organic group selected from the group consisting of alkyl, alkoxyl, acyl, acyloxy, sulfonyl, sulfonyloxy, sulfonylamino, aryl, aralkyl and alkoxycarbonyl groups.

6. The negative resist composition as claimed in claim 1, wherein the crosslinking agent (C) is a phenol derivative having:

3 to 5 benzene ring-atomic groups in its molecule;

a molecular weight of 1200 or less; and at least two substituents selected from the group consisting of hydroxymethyl and alkoxymethyl groups in the 3 to 5 benzene ring-atomic groups.

7. The negative resist composition as claimed in claim 1, which further comprises an organic basic compound.

8. The negative resist composition as claimed in claim 1, which further comprises a surfactant containing at least one of a fluorine atom and silicone atom.

9. The negative resist composition as claimed in claim 1, wherein the resin (A) has a molecular weight distribution (Mw/Mn) of from 1.0 to 1.4.

10. The negative resist composition as claimed in claim 1, wherein the resin (A) has a weight average molecular weight (Mw) of from 2000 to 9000.

11. The negative resist composition as claimed in claim 2, wherein the resin (A) contains a structural un it represented by formula (1):

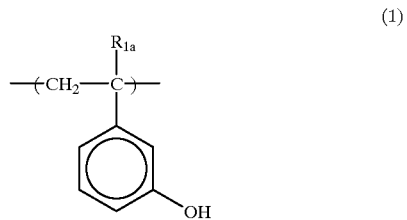

wherein $R_{1a}$ represents a hydrogen atom or a methyl group.

12. The negative resist composition as claimed in claim 2, wherein the resin (A) is a resin represented by formula (2):

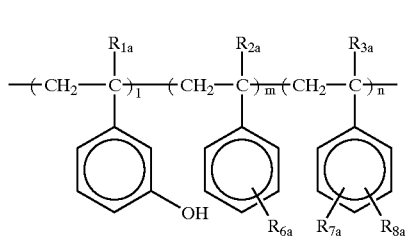

-continued

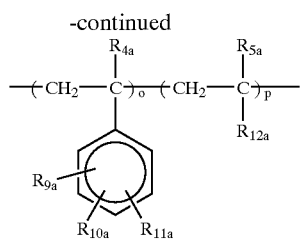

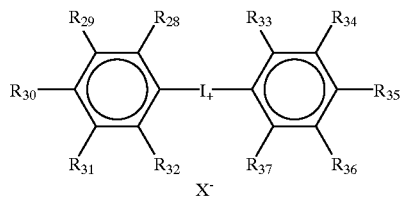

wherein $R_{1a}$ to $R_{5a}$ each independently represents a hydrogen atom or a methyl group; $R_{6a}$ to $R_{11a}$ each independently represents a hydrogen atom, an alkyl group having 1 to 4 carbon atoms, an alkoxy group having 1 to 4 carbon atoms, a hydroxyl group or —C(=O)O—$R_{14a}$; $R_{14a}$ represents a hydrogen atom or an alkyl group having 1 to 4 carbon atoms; $R_{12a}$ represents —COOR$_{15a}$; $R_{15a}$ represents a hydrogen atom or an alkyl group having 1 to 4 carbon atoms; $0<l\leq100$; $0\leq m<100$; $0\leq n<100$; $0\leq o<100$; $0\leq p<100$; and $l+m+n+o+p=100$.

13. The negative resist composition as claimed in claim 2, wherein the compound (B) contains at lease one compound represented by formulae (I) to (III):

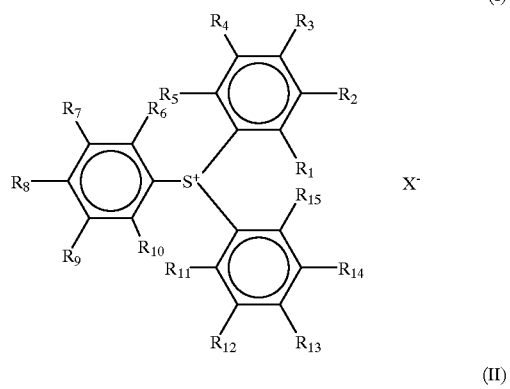

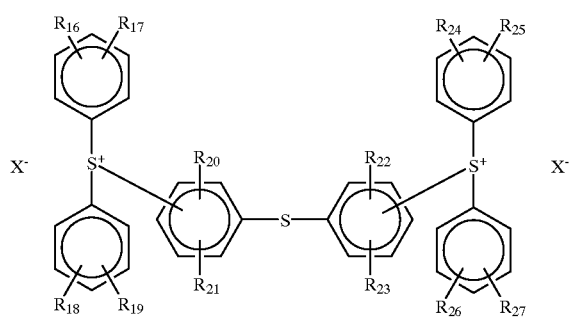

wherein $R_2$ to $R_{37}$ each independently represents a hydrogen atom, an alkyl group, an alkoxyl group, a hydroxyl group, a halogen atom or a group represented by —S—$R_{38}$; $R_{38}$ represents an alkyl group or an aryl group; two or more groups selected from $R_1$ to $R_{15}$ may be bonded to each other, either directly at the ends or mediated by an atom selected from oxygen, sulfur and nitrogen, to thereby form a cyclic structure; two or more groups selected from $R_{16}$ to $R_{27}$ may be bonded to each other, either directly at the ends or mediated by an atom selected from oxygen, sulfur and nitrogen, to thereby form a cyclic structure; two or more groups selected from $R_{28}$ to $R_{37}$ maybe bonded to each other, either directly at the ends or mediated by an atom selected from oxygen, sulfur and nitrogen, to thereby form a cyclic structure; and $X^-$ represents an anion of an acid which is selected from a benzenesulfonic acid, naphthalenesulfonic acid and anthracenesulfonic acid and has at least one organic group selected from the group consisting of alkyl, alkoxyl, acyl, acyloxyl, sulfonyl, sulfonyloxy, sulfonylamino, aryl, aralkyl and alkoxycarbonyl groups.

14. The negative resist composition as claimed in claim 2, wherein the crosslinking agent (C) is a phenol derivative having:
    3 to 5 benzene ring-atomic groups in its molecule;
    a molecular weight of 1200 or less; and
    at least two substituents selected from the group consisting of hydroxymethyl and alkoxymethyl groups in the 3 to 5 benzene ring-atomic groups.

15. The negative resist composition as claimed in claim 2, which further comprises an organic basic compound.

16. The negative resist composition as claimed in claim 2, which further comprises a surfactant containing at least one of a fluorine atom and silicone atom.

17. The negative resist composition as claimed in claim 2, wherein the resin (A) has the molecular weight distribution (Mw/Xn) of from 1.0 to 1.4.

18. The negative resist composition as claimed in claim 2, wherein the resin (A) has a weight average molecular weight (Mw) of from 2000 to 9000.

19. A method for forming a pattern comprises: applying the negative resist composition according to claim 1 on a substrate to form a resist film; irradiating the resist film with one of an electron beam and X ray; and developing the resist film.

20. A method for forming a pattern comprises: applying the negative resist composition according to claim 2 on a substrate to form a resist film; irradiating the resist film with one of an electron beam and X ray; and developing the resist film.

\* \* \* \* \*